(12) United States Patent
Chang et al.

(10) Patent No.: US 9,397,013 B2
(45) Date of Patent: Jul. 19, 2016

(54) METHOD OF CONTROLLING AN ETCHING PROCESS FOR FORMING FINE PATTERNS OF A SEMICONDUCTOR DEVICE

(71) Applicant: Samsung Electronics Co., Ltd., Suwon-si, Gyeonggi-do (KR)

(72) Inventors: Chongkwang Chang, Bucheon-si (KR); Sungwoo Kang, Suwon-si (KR); Chunghowan Kim, Yongin-si (KR); Youngmook Oh, Hwaseong-si (KR); Seobum Lee, Seoul (KR); Gahyun Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/854,528

(22) Filed: Sep. 15, 2015

(65) Prior Publication Data

US 2016/0099185 A1  Apr. 7, 2016

(30) Foreign Application Priority Data

Oct. 6, 2014 (KR) .................. 10-2014-0134127

(51) Int. Cl.
*H01L 21/00* (2006.01)
*H01L 21/66* (2006.01)
*H01L 21/308* (2006.01)

(52) U.S. Cl.
CPC ............ *H01L 22/20* (2013.01); *H01L 21/3085* (2013.01)

(58) Field of Classification Search
CPC ... H01L 21/3085; H01L 21/308; H01L 21/31; H01L 21/3081; H01L 21/3083; H01L 22/20; H01L 22/22
USPC .......................................................... 438/5
See application file for complete search history.

(56) References Cited

U.S. PATENT DOCUMENTS

| | | | |
|---|---|---|---|
| 8,007,968 B2 | 8/2011 | Yamada et al. | |
| 8,198,183 B2 | 6/2012 | Yatsuda et al. | |
| 8,232,212 B2 | 7/2012 | Davis et al. | |
| 8,241,924 B2 | 8/2012 | Cheng et al. | |
| 8,298,954 B1 * | 10/2012 | Arnold | H01L 21/0337 257/E21.235 |
| 8,321,816 B2 | 11/2012 | Arai | |
| 8,361,684 B2 | 1/2013 | Hsieh et al. | |
| 8,429,569 B2 | 4/2013 | Yu et al. | |
| 8,683,395 B2 | 3/2014 | Yu et al. | |
| 9,188,864 B2 * | 11/2015 | Bae | G03F 7/0392 |
| 2004/0214445 A1 * | 10/2004 | Shimizu | H01L 21/32139 438/706 |
| 2008/0188083 A1 * | 8/2008 | Jeon | H01L 21/0337 438/703 |
| 2008/0248412 A1 | 10/2008 | Stuber et al. | |
| 2009/0269924 A1 * | 10/2009 | Choi | H01L 21/0337 438/669 |
| 2010/0248153 A1 * | 9/2010 | Lee | H01L 21/0337 430/312 |
| 2013/0270624 A1 * | 10/2013 | Yun | H01L 29/792 257/324 |
| 2013/0288482 A1 * | 10/2013 | Nam | H01L 21/0273 438/703 |
| 2014/0284679 A1 * | 9/2014 | Ohba | H01L 29/792 257/315 |
| 2015/0348988 A1 * | 12/2015 | Song | H01L 27/11582 257/314 |

FOREIGN PATENT DOCUMENTS

| | | |
|---|---|---|
| JP | 2004259720 | 9/2004 |
| KR | 100919802 | 10/2009 |
| KR | 100935731 | 1/2010 |
| KR | 2010050937 | 5/2010 |

* cited by examiner

*Primary Examiner* — Thanh T Nguyen
(74) *Attorney, Agent, or Firm* — Onello & Mello, LLP

(57) ABSTRACT

A method of controlling an etching process for forming fine patterns of a semiconductor device includes forming a lower pattern having a plurality of openings on a substrate, obtaining a width value of the lower pattern, and controlling a process recipe of an etching process for forming the lower pattern by using the width value.

15 Claims, 20 Drawing Sheets

METHOD OF CONTROLLING AN ETCHING PROCESS FOR FORMING FINE PATTERNS OF A SEMICONDUCTOR DEVICE

CROSS-REFERENCE TO RELATED APPLICATION

This U.S. non-provisional patent application claims priority under 35 U.S.C. §119 to Korean Patent Application No. 10-2014-0134127, filed on Oct. 6, 2014, in the Korean Intellectual Property Office, the disclosure of which is hereby incorporated by reference in its entirety.

BACKGROUND

Inventive concepts relate to a method of controlling an etching process for forming fine patterns of a semiconductor device. More particularly, the inventive concepts relate to a method of controlling an etching process using an advanced process control (APC) method.

Processes of manufacturing a semiconductor device may include deposition processes, ion implantation processes, photolithography processes, and etching processes, for example. The semiconductor processes may be performed on one semiconductor wafer to manufacture the semiconductor device. However, when the semiconductor process is repeatedly and continuously performed on a semiconductor wafer by a semiconductor wafer treating apparatus, variations may arise in the processes and in the resulting devices. If the process ability of the semiconductor wafer treating apparatus is varied, dispersion of process result values (e.g., process dispersion) used for monitoring the semiconductor process may also be varied. Thus, it may be required to control the process dispersion.

Patterns become smaller, pitches finer, and elements smaller as more and more elements are integrated into a highly integrated semiconductor device. The pitch corresponds to a sum of a width of each of the patterns and a distance between the patterns. As design rules of semiconductor devices are reduced, it may be difficult to form patterns having ever finer pitches due to limitations of resolution of photolithography processes, for example.

SUMMARY

Exemplary embodiments in accordance with principle of inventive concepts may provide a method of controlling an etching process capable of improving process dispersion.

In exemplary embodiments in accordance with principles of inventive concepts, a method may include: forming a lower pattern having a plurality of openings on a substrate; obtaining a width value of the lower pattern; and controlling a process recipe of an etching process for forming the lower pattern by using the width value. Forming the lower pattern may include: sequentially forming a first mask layer and a hard mask layer on a lower layer; patterning the hard mask layer to form hard mask patterns, the hard mask patterns comprising: first line mask patterns extending in a first direction and spaced apart from each other in a second direction intersecting the first direction; forming second line mask patterns intersecting the first line mask patterns and extending in the second direction; etching the first mask layer by an etching process using the first and second line mask patterns as etch masks to form a first mask pattern; and etching the lower layer by an etching process using the first mask pattern as an etch mask. Patterning the hard mask layer may include: performing a first etching process. Controlling the process recipe of the etching process for forming the lower pattern may include: controlling a process recipe of the first etching process.

In exemplary embodiments in accordance with principles of inventive concepts, the openings may be arranged along the first direction and the second direction, and the width value may correspond to a distance between the openings adjacent to each other in the second direction.

In exemplary embodiments in accordance with principles of inventive concepts, patterning the hard mask layer to form the hard mask patterns may include: sequentially forming a sacrificial mask layer and a first anti-reflection layer on the hard mask layer; and forming first photoresist patterns on the first anti-reflection layer. The first etching process may be performed on the substrate having the first photoresist patterns to sequentially etch the first anti-reflection layer, the sacrificial mask layer, and the hard mask layer.

In exemplary embodiments in accordance with principles of inventive concepts, the first etching process may include a first step for etching the first anti-reflection layer, a second step for etching the sacrificial mask layer, and a third step for etching the hard mask layer. The first, second, and third steps may be sequentially performed in the same chamber, and controlling the process recipe of the first etching process may include: controlling a process recipe of the first step.

In exemplary embodiments in accordance with principles of inventive concepts, at least one of the first line mask patterns may have opposite sidewalls having protrusions, and the protrusions adjacent to each other among the protrusions may protrude in directions opposite to each other and may not be overlapped with each other in the second direction.

In exemplary embodiments in accordance with principles of inventive concepts, the hard mask patterns may further include: assistant mask patterns of which each has an island shape that is long in the first direction. Each of the assistant mask patterns may be disposed opposite a corresponding protrusion of the at least one of the first line mask patterns so as to be aligned with the corresponding protrusion in the second direction.

In exemplary embodiments in accordance with principles of inventive concepts, the second line mask patterns may intersect the assistant mask patterns and the protrusions, and the etching process for forming the first mask pattern may use the first and second line mask patterns and the assistant mask patterns as etch masks.

In exemplary embodiments in accordance with principles of inventive concepts the plurality of openings may include: a first group including some of the openings; and a second group including others of the openings. The openings of the first group may be spaced apart from each other in the second direction and may have lengths in the second direction which are substantially equal to each other. The openings of the second group may be spaced apart from the openings of the first group in the first direction. The openings of the second group may be spaced apart from each other in the second direction and may have lengths in the second direction which are different from each other. In this case, the width value may correspond to a distance between the openings of the first group adjacent to each other in the second direction.

In exemplary embodiments in accordance with principles of inventive concepts, controlling the process recipe may include: controlling at least one of an etching time, the amount of an etchant, or a kind of the etchant.

In exemplary embodiments in accordance with principles of inventive concepts, a method may include: forming a lower pattern having a plurality of openings on a substrate; obtaining a width value of the lower pattern; and controlling a process recipe of an etching process for forming the lower pattern by using the width value. Forming the lower pattern may include: sequentially forming a first mask layer and an etch stop layer on a lower layer; forming hard mask patterns on the etch stop layer, the hard mask patterns comprising: first line mask patterns extending in a first direction and spaced apart from each other in a second direction intersecting the first direction; forming a second mask layer covering the hard mask patterns on the etch stop layer, the second mask layer including an organic material; forming a first anti-reflection layer on the second mask layer; forming first photoresist patterns on the first anti-reflection layer, the first photoresist patterns extending in the second direction to intersect the first line mask patterns when viewed from a plan view; and performing a first etching process on the substrate having the first photoresist patterns to sequentially etch the first anti-reflection layer, the second mask layer, the etch stop layer, the first mask layer, and the lower layer. Controlling the process recipe of the etching process for forming the lower pattern may include: controlling a process recipe of the first etching process for etching the etch stop layer.

In exemplary embodiments in accordance with principles of inventive concepts, the openings may be arranged in the first direction and the second direction, and the width value may correspond to a distance between the openings adjacent to each other in the second direction.

In exemplary embodiments in accordance with principles of inventive concepts, the first etching process may include a first step for etching the first anti-reflection layer, a second step for etching the second mask layer, a third step for etching the etch stop layer, a fourth step for etching the first mask layer, and a fifth step for etching the lower layer. The first to fifth steps may be sequentially performed in the same chamber, and controlling the process recipe of the etching process for forming the lower pattern may include: controlling a process recipe of the third step of the first etching process.

In exemplary embodiments in accordance with principles of inventive concepts, forming the hard mask patterns may include: sequentially forming a hard mask layer, a sacrificial mask layer, and a second anti-reflection layer on the etch stop layer; forming second photoresist patterns on the second anti-reflection layer; and performing a second etching process on the substrate having the second photoresist patterns to sequentially etch the second anti-reflection layer, the sacrificial mask layer, and the hard mask layer.

In exemplary embodiments in accordance with principles of inventive concepts, at least one of the first line mask patterns may have opposite sidewalls having protrusions. The protrusions adjacent to each other among the protrusions may protrude in directions opposite to each other and may not be overlapped with each other in the second direction.

In exemplary embodiments in accordance with principles of inventive concepts, the hard mask patterns may further include: assistant mask patterns of which each has an island shape that is long in the first direction. Each of the assistant mask patterns may be disposed opposite a corresponding protrusion of the at least one of the first line mask patterns so as to be aligned with the corresponding protrusion in the second direction. The first photoresist patterns may intersect the assistant mask patterns and the protrusions when viewed from a plan view.

In exemplary embodiments in accordance with principles of inventive concepts, the plurality of openings may include: a first group including some of the openings; and a second group including others of the openings. The openings of the first group may be spaced apart from each other in the second direction and may have lengths in the second direction which are substantially equal to each other. The openings of the second group may be spaced apart from the openings of the first group in the first direction. The openings of the second group may be spaced apart from each other in the second direction and may have lengths in the second direction which are different from each other. In this case, the width value may correspond to a distance between the openings of the first group adjacent to each other in the second direction.

In exemplary embodiments in accordance with principles of inventive concepts, a method may include: forming a lower pattern having a plurality of openings on a substrate; obtaining a width value of the lower pattern; and controlling a process recipe of an etching process for forming the lower pattern by using the width value. Forming the lower pattern may include: sequentially forming a first mask layer, an etch stop layer, and a hard mask layer on a lower layer; patterning the hard mask layer using a first etching process to form hard mask patterns, the hard mask patterns comprising: first line mask patterns extending in a first direction and spaced apart from each other in a second direction intersecting the first direction; forming a second mask layer covering the hard mask patterns on the etch stop layer, the second mask layer including an organic material; forming a first anti-reflection layer on the second mask layer; forming first photoresist patterns on the first anti-reflection layer, the first photoresist patterns extending in the second direction to intersect the first line mask patterns when viewed from a plan view; and performing a second etching process on the substrate having the first photoresist patterns to sequentially etch the first anti-reflection layer, the second mask layer, the etch stop layer, the first mask layer, and the lower layer. Controlling the process recipe of the etching process for forming the lower pattern may include: controlling a process recipe of the first etching process or controlling a process recipe of the second etching process.

In exemplary embodiments in accordance with principles of inventive concepts, the openings may be arranged in the first direction and the second direction, and the width value may correspond to a distance between the openings adjacent to each other in the second direction.

In exemplary embodiments in accordance with principles of inventive concepts, forming the hard mask patterns may include: sequentially forming a hard mask layer, a sacrificial mask layer, and a second anti-reflection layer on the etch stop layer; forming second photoresist patterns on the second anti-reflection layer; and performing the first etching process on the substrate having the second photoresist patterns to sequentially etch the second anti-reflection layer, the sacrificial mask layer, and the hard mask layer. Controlling the process recipe of the first etching process may include controlling a process recipe for etching the second anti-reflection layer.

In exemplary embodiments in accordance with principles of inventive concepts, the second etching process may include a first step for etching the first anti-reflection layer, a second step for etching the second mask layer, a third step for etching the etch stop layer, a fourth step for etching the first mask layer, and a fifth step for etching the lower layer. The first to fifth steps may be sequentially performed in the same chamber, and controlling the process recipe of the second etching process may include: controlling a process recipe of the third step.

In exemplary embodiments in accordance with principles of inventive concepts a method of forming a semiconductor device includes forming a hard mask pattern including line patterns and assistant patterns therebetween over a lower layer in which fine patterns are to be formed, measuring a width between openings in the lower layer; and using the width measurement to control an etching process employed to form the hard mask pattern.

In exemplary embodiments in accordance with principles of inventive concepts a method of forming a semiconductor device includes a process of etching process employed to form the hard mask pattern includes etching an anti-reflection layer, etching a sacrificial mask layer, and etching a hard mask layer and all the etching steps are carried out sequentially within the same chamber.

In exemplary embodiments in accordance with principles of inventive concepts a method of forming a semiconductor device includes forming openings in the lower layer.

In exemplary embodiments in accordance with principles of inventive concepts a method of forming a semiconductor device includes filling the openings with metallization to form fine patterns.

In exemplary embodiments in accordance with principles of inventive concepts a method of forming a semiconductor device includes storing the measurement of width on the lower layer and retrieving it for controlling the etching process in the formation of a subsequent hard mask pattern.

BRIEF DESCRIPTION OF THE DRAWINGS

Inventive concepts will become more apparent in view of the attached drawings and accompanying detailed description.

DETAILED DESCRIPTION OF THE EMBODIMENTS

Figure 1:
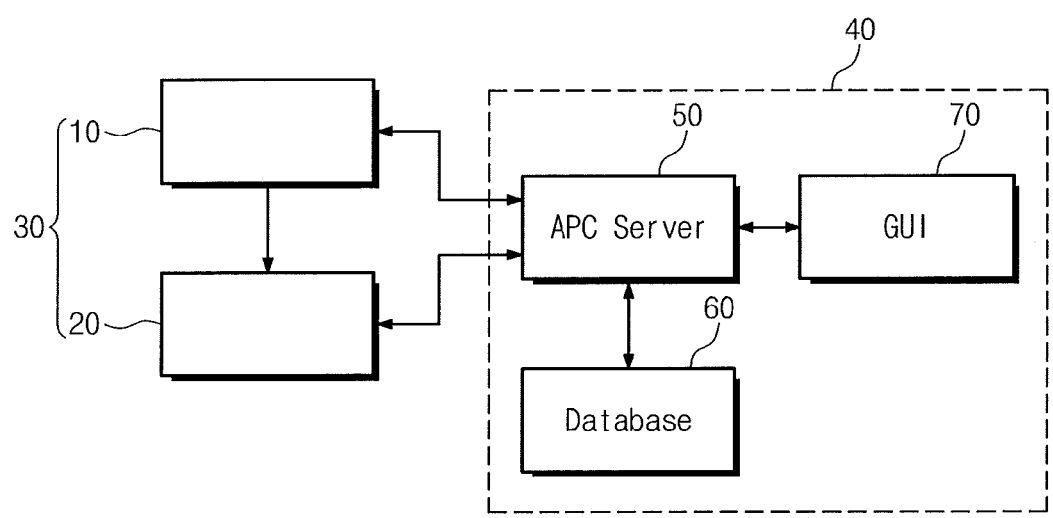
FIG. 1 is a schematic block diagram illustrating a system of controlling a semiconductor process according to exemplary embodiments in accordance with principles of inventive concepts.

Inventive concepts will now be described more fully hereinafter with reference to the accompanying drawings, in which exemplary embodiments of inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

A hard mask pattern including line patterns and assistant patterns therebetween may be formed over a lower layer within which fine patterns are to be formed. Openings may be formed in the lower layer and those openings may be filled to form the fine patterns. In exemplary embodiments in accordance with principles of inventive concepts, a width between openings in the lower layer may be measured and compared to a desired, or specified, value and an etch process employed to form the hard mask pattern may be adjusted according to the outcome of the comparison; to ensure that the width is as designed.

The line patterns of the hard mask may include non-overlapping protrusions running on alternate sides of the line patterns. The assistant patterns may be elongated island patterns formed on the opposite side of the line pattern from, and aligned with, an associated protrusion. The basic width of the line pattern, the width not including a protrusion, may closely correspond to the width between openings in the lower layer.

The hard mask pattern may be formed in a process that includes etching an anti-reflective layer, etching a sacrificial mask layer, and etching a hard mask layer. Each etching step may employ a different etching recipe, yet all three etching steps may be carried out in sequence, continuously, in the same chamber. In exemplary embodiments, the measured width between openings in the lower layer may be used to control etching of the anti-reflective layer, for example, in subsequent etching processes.

A second photoresist pattern may be formed on stacked layers over the hard mask pattern. The second photoresist pattern may include line patterns that are perpendicular to the line patterns of the hard mask and, therefore, their projection onto the hard mask pattern intersects the line patterns of the hard mask pattern and may partially overlap protrusions in the hard mask pattern. An etching process may be employed to selectively remove the photoresist, stacked layers, and hard mask to thereby form the openings in the lower layer.

Fine patterns may be formed in the openings of the lower pattern, for example, by forming a filling layer on the lower pattern and planarizing the result to form the fine patterns. The fine patterns may be formed of a conductive material, a semiconductor material, or an insulating material, for example.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic block diagram illustrating a system for controlling a semiconductor process according to exemplary embodiments in accordance with principles of inventive concepts. For example, FIG. 1 illustrates a system that controls an etching process for forming fine patterns of a semiconductor device by means of an etching apparatus.

Referring to FIG. 1, a system for controlling a semiconductor process according to exemplary embodiments may include a semiconductor process apparatus 10, a measurement apparatus 20, and an advanced process control (APC) system 40. The semiconductor process apparatus 10 and the measurement apparatus 20 may be included in semiconductor apparatuses 30, for example.

The semiconductor process apparatus 10 may include a photolithography apparatus, an etching apparatus, a deposition apparatus, a diffusion apparatus, a coating apparatus, or an oxidation apparatus, for example. In exemplary embodiments, the semiconductor process apparatus 10 may be the etching apparatus. The measurement apparatus 20 may include at least one of various measurement apparatuses used for measuring a process result of the semiconductor process apparatus 10. In some embodiments, if the semiconductor process apparatus 10 is the etching apparatus, the measurement apparatus 20 may be a critical dimension scanning electron microscope (CD-SEM) measuring a critical dimension (CD) value of a semiconductor pattern, for example. The APC system 40 may include an APC server 50, a database 60, and a graphic user interface (GUI) unit 70.

The etching apparatus may be an apparatus that performs an etching process used for forming a pattern on a semiconductor substrate. The etching apparatus may receive process-recipe data necessary to the etching process from the APC server 50, thereby performing the etching process. In some exemplary embodiments, the process-recipe data necessary to the etching process may include at least one of an etching time, the amount of an etchant, or a ratio of a plurality of etchants. In some embodiments, the etching process may include a plurality of steps that etches a plurality of stacked thin layers in-situ. In such embodiments, etching process recipes of the steps may be different from each other.

The measurement apparatus 20 may measure a CD value of the formed semiconductor pattern after the etching process and may transmit the measured CD value to the APC server 50.

The database 60 may store the process-recipe data of various semiconductor apparatuses performing unit processes (e.g., the semiconductor processes) of the semiconductor device. For example, the database 60 may store etching process-recipe data including at least one of an etching time, the amount of an etchant, or a ratio of a plurality of etchants, which are necessary to the etching process. In addition, the database 60 may store a target value of a process result of each of the unit processes and measurement data of a process result obtained after a real process, or process execution. For example, the database 60 may store the measurement data that includes a CD value measured by the measurement apparatus 20 after the etching process.

The APC server 50 may be connected to various semiconductor apparatuses (e.g., photolithography, etching, deposition, diffusion, coating, oxidation apparatus, and/or measurement apparatuses) performing the unit processes of the semiconductor device, so the APC server 50 may provide process-control data controlling each of the unit processes and may manage each of the unit processes in real time. For example, the APC server 50 may compare the process-recipe data of the performed unit process with the measurement data measured after the unit process to calculate process-recipe data (i.e., the process-control data) optimized for obtaining a target value (e.g., a target CD value) of a desired process result by a previously designed APC logic. The semiconductor process apparatuses 10 may receive the process-recipe data calculated from the APC server 50 to perform a corresponding process under a process recipe that is modified to obtain the desired process result.

The GUI unit 70 may correspond to a user interface unit. The GUI unit 70 may display process states of the semiconductor apparatuses 30 controlled by the APC system 40, so a user may view the displayed process states.

The etching process for forming the fine patterns according to embodiments may be controlled using the system of controlling the semiconductor process (or the unit process).

Hereinafter, a method of forming fine patterns according to inventive concepts will be described, then a method of controlling the etching process for forming the fine patterns according to embodiments will be described.

Figure 2:
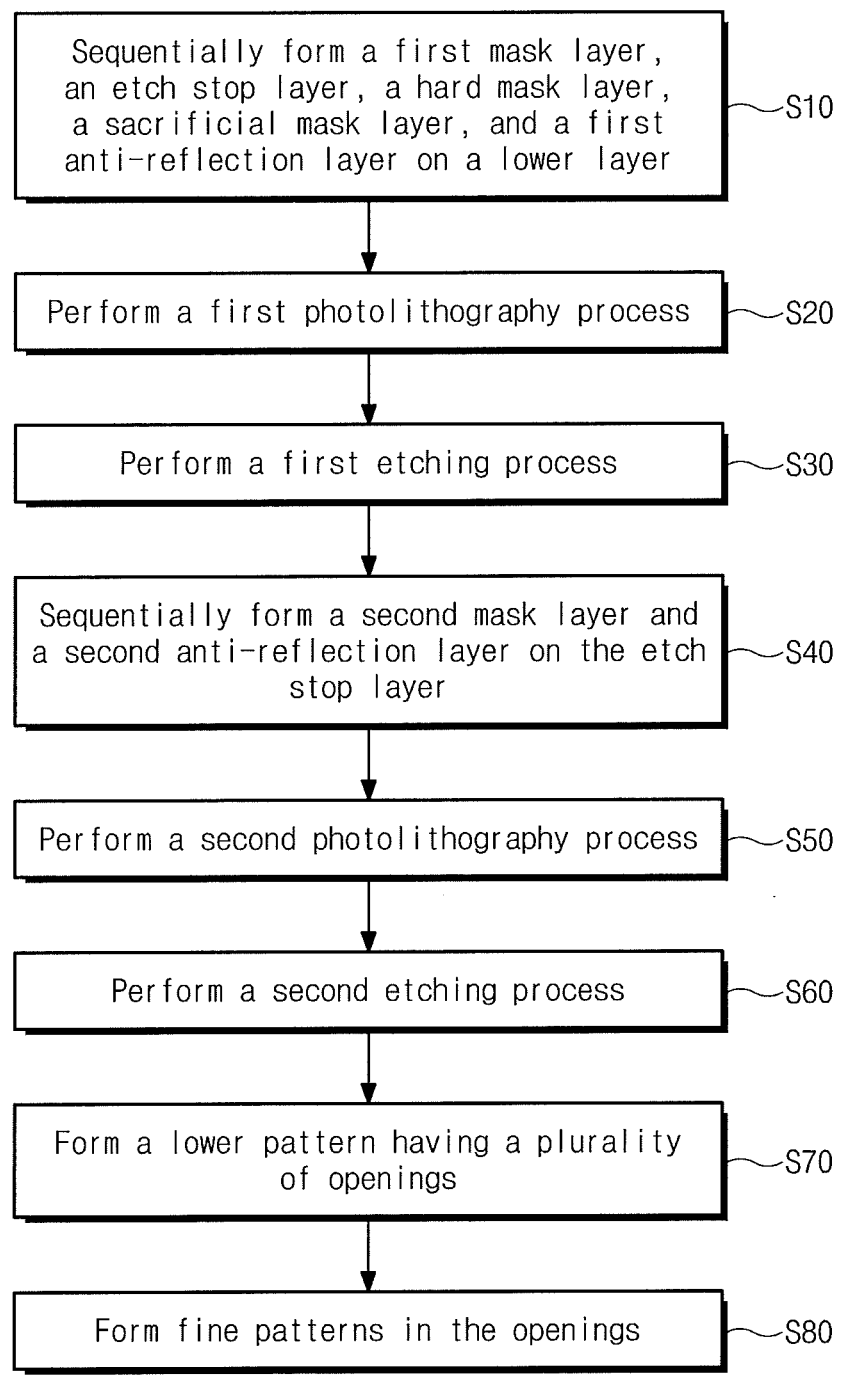
FIG. 2 is a flowchart illustrating a method of forming fine patterns of a semiconductor device according to exemplary embodiments in accordance with principles of inventive concepts.
Figure 3:
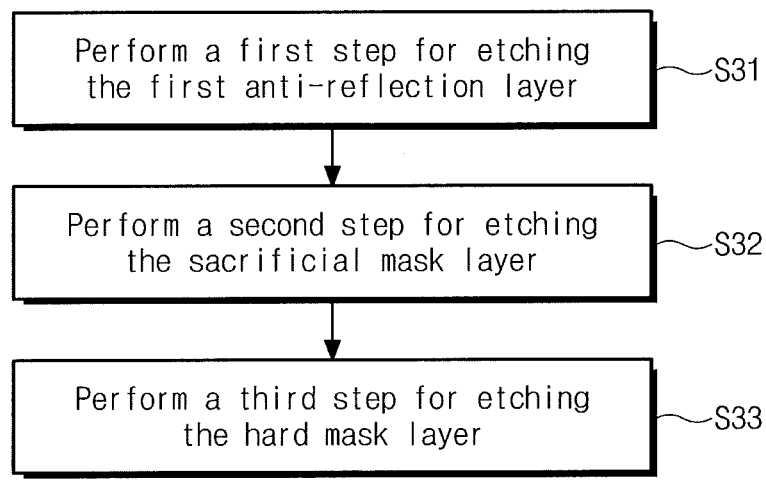
FIGS. 3 and 4 are flowcharts minutely illustrating a step S30 and a step S60 of FIG. 2, respectively.
Figure 4:
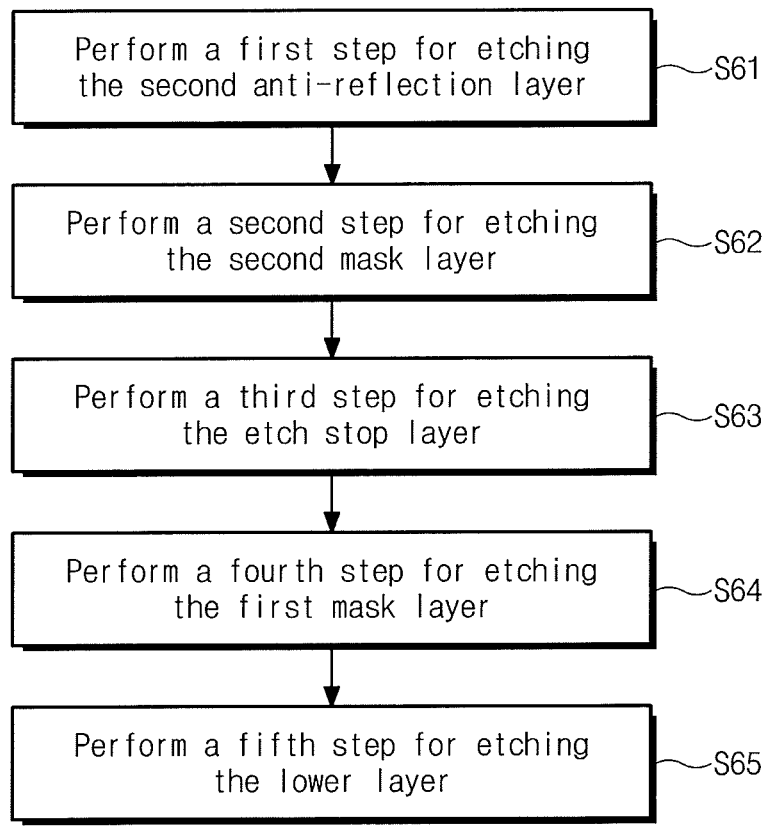

FIG. 2 is a flowchart illustrating a method of forming fine patterns of a semiconductor device according to exemplary embodiments in accordance with principles of inventive concepts. FIGS. 3 and 4 are flowcharts illustrating a step S30 and a step S60 of FIG. 2, respectively, in greater detail. FIGS. 5, 6A, 7A, 8A, 9, 10A, and 11 are perspective views illustrating a method of forming fine patterns of a semiconductor device according to exemplary embodiments in accordance with principles of inventive concepts. FIGS. 6B, 7B, 8B, and 10B are plan views of FIGS. 6A, 7A, 8A, and 10A, respectively.

Figure 5:
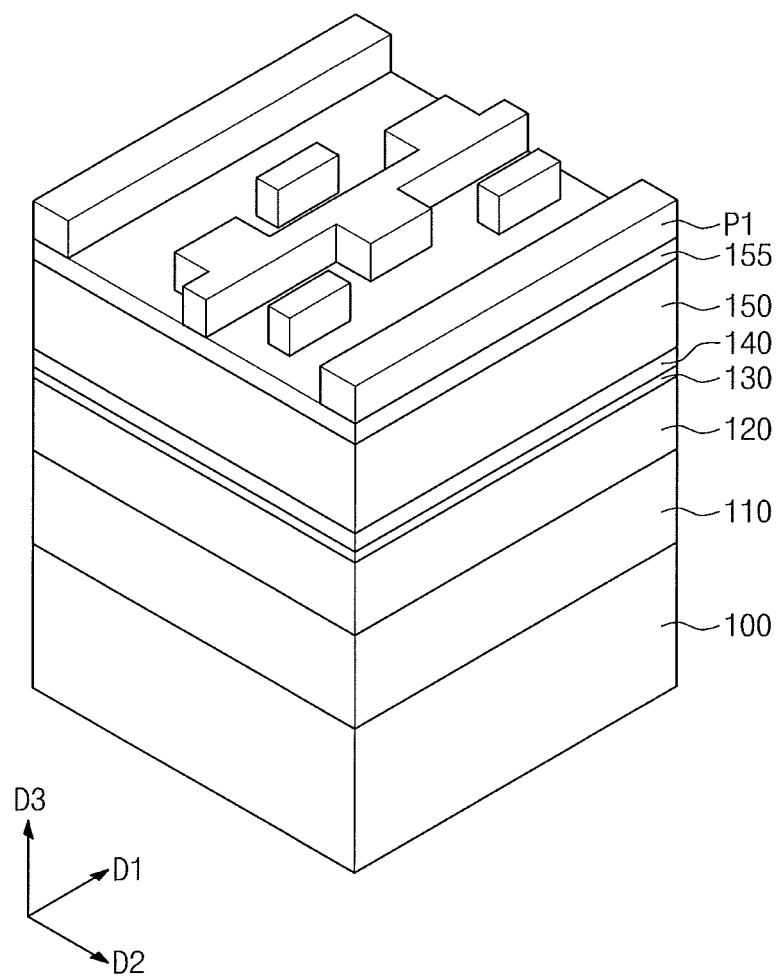
FIGS. 5, 6A, 7A, 8A, 9, 10A, and 11 are perspective views illustrating a method of forming fine patterns of a semiconductor device according to exemplary embodiments in accordance with principles of inventive concepts.

Referring to FIGS. 2 and 5, a lower layer 110, a first mask layer 120, an etch stop layer 130, and a hard mask layer 140 may be sequentially formed on a substrate 100 (S10).

The substrate 100 may include a semiconductor material. In exemplary embodiments, the substrate 100 may be a semiconductor substrate or an epitaxial layer. For example, the substrate 100 may include at least one of crystalline silicon, amorphous silicon, silicon doped with dopants, or silicon-germanium.

The lower layer 110 may include at least one of an insulating material, a semiconductor material, or a conductive material. In some embodiments, if the lower layer 110 is formed of the insulating material, the lower layer 110 may include at least one of silicon oxide, silicon nitride, silicon oxynitride, or a low-k dielectric material having a low dielectric constant, for example. If the lower layer 110 is formed of semiconductor material, the lower layer 110 may be a semiconductor substrate or an epitaxial layer. If the lower layer 110 is formed of conductive material, the lower layer 110 may include at least one of doped poly-silicon, a metal silicide, a metal, or a metal nitride. Alternatively, the lower layer 110 may be formed of crystalline silicon, amorphous silicon, silicon doped with dopants, silicon-germanium, or a carbon-based material, for example. In exemplary embodiments, the lower layer 110 may be a silicon oxide layer which is formed by a chemical vapor deposition (CVD) process.

In addition, the lower layer 110 may be a single layer, or a stack (or "stacked") layer including a plurality of stacked layers. In exemplary embodiments, the lower layer 110 may include a plurality of stacked insulating layers.

The first mask layer 120 may be formed of a material that has an etch selectivity with respect to the lower layer 110 during a process of etching the lower layer 110. In some exemplary embodiments, the first mask layer 120 may be formed of an organic mask layer. For example, the first mask layer 120 may be formed of a spin-on-hardmask (SOH) layer or an amorphous carbon layer (ACL). The SOH layer may include a carbon-based SOH layer or a silicon-based SOH layer.

The etch stop layer 130 may be formed of a material having an etch selectivity with respect to the first mask layer 120 and the hard mask layer 140. For example, the etch stop layer 130 may be formed of at least one of silicon oxide, silicon oxynitride, silicon nitride, silicon carbo-nitride, or silicon carbide. In exemplary embodiments, the etch stop layer 130 may be a silicon oxide layer that is formed by an atomic layer deposition (ALD) process.

The hard mask layer 140 may be formed of a material that has an etch selectivity with respect to the first mask layer 120 during a process of etching the first mask layer 120. For example, the hard mask layer 140 may include at least one of silicon-based materials such as poly-silicon, silicon oxynitride, silicon nitride, and silicon carbo-nitride. In exemplary embodiments, the hard mask layer 140 may be formed of a silicon nitride layer.

Next, a sacrificial mask layer 150 and a first anti-reflection layer 155 may be sequentially formed on the hard mask layer 140 (S10). The sacrificial mask layer 150 may be formed of a material having an etch selectivity with respect to the hard mask layer 140. In an embodiment, the sacrificial mask layer 150 may be formed of the same material as the first mask layer 120.

The first anti-reflection layer 155 may be formed of a material that has an etch selectivity with respect to the sacrificial mask layer 150 and absorbs light to prevent reflection of the light during an exposure process. The first anti-reflection layer 155 may be formed of at least one of an organic material and an inorganic material. According to an exemplary embodiment, the first anti-reflection layer 155 may be formed of an organic material layer of which an etch characteristic is similar to that of a photoresist. According to another exemplary embodiment, the first anti-reflection layer 155 may be formed of a silicon oxynitride layer and the above organic material layer which are stacked.

A first photolithography process may be performed to form first photoresist patterns P1 on the first anti-reflection layer 155 (S20). For example, a first photoresist layer may be coated on the first anti-reflection layer 155, and an exposure process and a development process may be performed on the first photoresist layer to form the first photoresist patterns.

Because, in accordance with principles of inventive concepts, the first anti-reflection layer 155 is formed between the sacrificial mask layer 150 and the first photoresist layer, it is possible to prevent widths of the first photoresist patterns P1 from being varied by reflection and scattering of light irradiated to the first photoresist layer during the first photolithography process forming the first photoresist patterns P1. Planar shapes of the first photoresist patterns P1 may be the substantially same as planar shapes of hard mask patterns 142 of FIG. 6 which will be described later. Planar shapes of the first photoresist patterns P1 will be described later in more detail.

Referring to FIGS. 2, 3, 6A, and 6B, a first etching process may be performed on the substrate 100 having the first photoresist patterns P1 to sequentially etch the first anti-reflection layer 155, the sacrificial mask layer 150, and the hard mask layer 140 (S30). As a result, hard mask patterns 142 exposing the etch stop layer 130 may be formed.

In some exemplary embodiments, performing the first etching process (S30) may include performing a first step for etching the first anti-reflection layer 155 (S31), performing a second step for etching the sacrificial mask layer 150 (S32), and performing a third step for etching the hard mask layer 140 (S33), for example.

For example, in the first step of the first etching process, the first anti-reflection layer 155 exposed by the first photoresist patterns P1 may be etched until the sacrificial mask layer 150 is exposed. In the second step of the first etching process, the exposed sacrificial mask layer 150 may be etched until the hard mask layer 140 is exposed. In the third step of the first etching process, the exposed hard mask layer 140 may be etched until the etch stop layer 130 is exposed. The first anti-reflection layer 155 and the sacrificial mask layer 150 may be sequentially etched by the first and second steps to form first anti-reflection patterns and sacrificial mask patterns. The hard mask layer 140 may be etched by the third step to form the hard mask patterns 142. The first and second steps may be performed using the first photoresist patterns P1 as etch masks and the third step may be performed using the first anti-reflection patterns and the sacrificial mask patterns as etch masks.

In exemplary embodiments, the first, second, and third steps of the first etching process may be performed using different etching process recipes from each other. The etching process recipe of each of the first to third steps may be determined by the process recipe calculated from the APC server 50 of FIG. 1. In some embodiments, the first to third steps of the first etching process may be continuously performed in the same chamber of the same etching apparatus. That is, the first to third steps of the first etching process may be carried out without interruption and without removal from the chamber.

During the first etching process, the first photoresist patterns P1 and the first anti-reflection layer 155 may be removed but portions of the sacrificial mask layer 150 may remain. The remaining portions of the sacrificial mask layer 150 may be removed by an ashing process and/or a strip process, for example.

The hard mask patterns 142 may include first line mask patterns 144 and assistant mask patterns 146. The first line mask patterns 144 may have line shapes extending in a first direction D1 and may be spaced apart from each other in a second direction D2 intersecting the first direction D1. In some exemplary embodiments, opposite sidewalls of at least one of the first line mask patterns 144 may have protrusions 144P. The protrusions 144P may be spaced apart from each other and may be arranged in an alternating, or zigzag, form along the first direction D1. In other words, the protrusions 144P adjacent to each other may protrude in opposite directions to each other and may not overlap with each other in the second direction D2.

The assistant mask patterns 146 may be disposed between the first line mask patterns 144. Each of the assistant mask patterns 146 may have an island shape that is relatively long in the first direction D1. In some exemplary embodiments, each of the assistant mask patterns 146 may be disposed at a side of the first line mask pattern 144 having the protrusions 144P. In such embodiments, each of the assistant mask patterns 146 may face a sidewall of the first line mask pattern 144 opposite to the protrusion 144P. Each of the assistant mask patterns 146 may be aligned with the protrusion 144P corresponding thereto in the second direction D2. In other words, each of the assistant mask patterns 146 may overlap with the protrusion 144P corresponding thereto in the second direction D2.

Figure 6A:
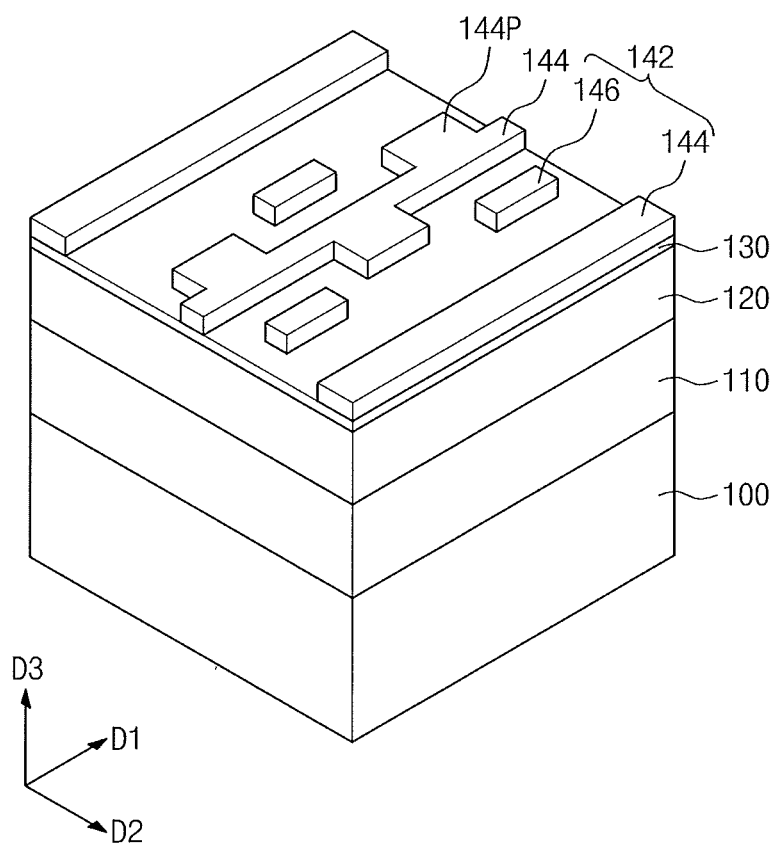
Figure 6B:
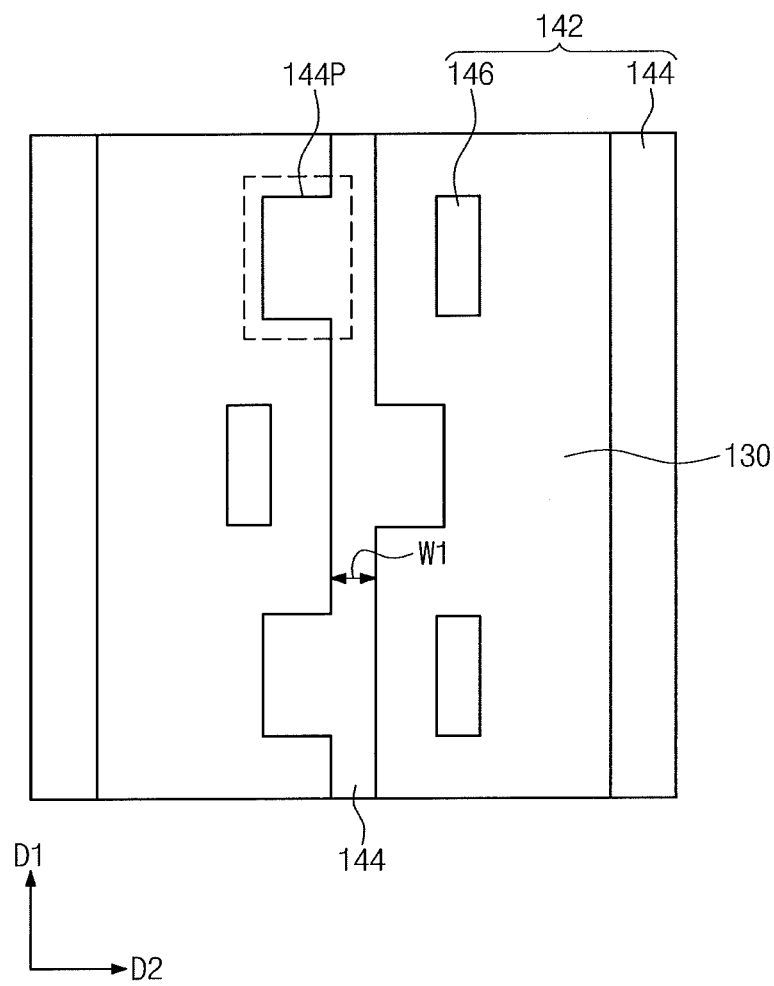
FIGS. 6B, 7B, 8B, and 10B are plan views of FIGS. 6A, 7A, 8A, and 10A, respectively.

In other exemplary embodiments, unlike FIGS. 6A and 6B, the hard mask patterns 142 may not include the assistant mask patterns 146 but may consist of the first line mask patterns 144.

In some exemplary embodiments, the first line mask pattern 144 having the protrusions 144P may have a first width W1. In such embodiments, the first width W1 may be defined as a width, in the second direction D2, of a portion of the first line mask pattern 144 disposed between the protrusions 144P adjacent to each other. The first width W1 may be measured by the measurement apparatus 20 (e.g., the CD-SEM) of FIG. 1 after the formation of the hard mask patterns 142.

Figure 7A:
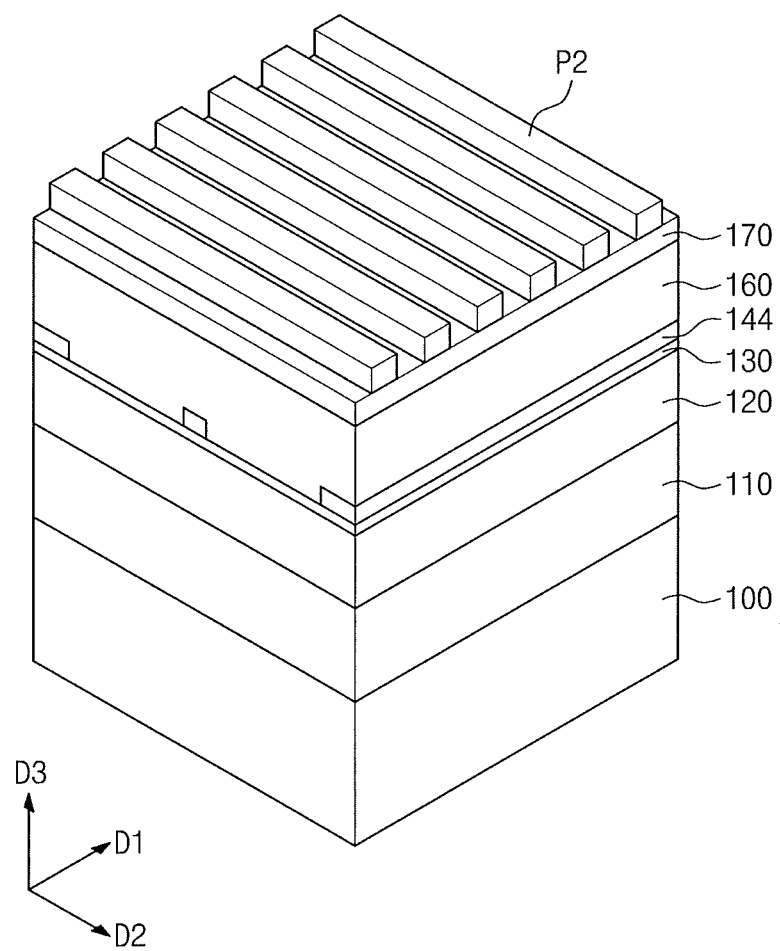
Figure 7B:
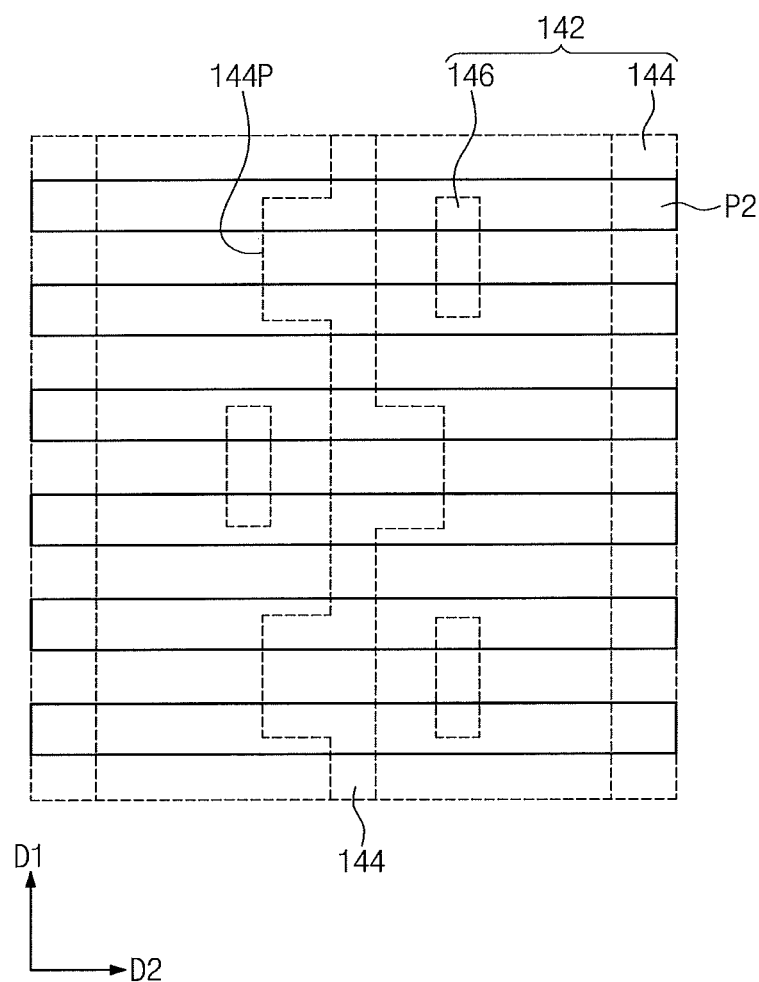
Figure 8A:
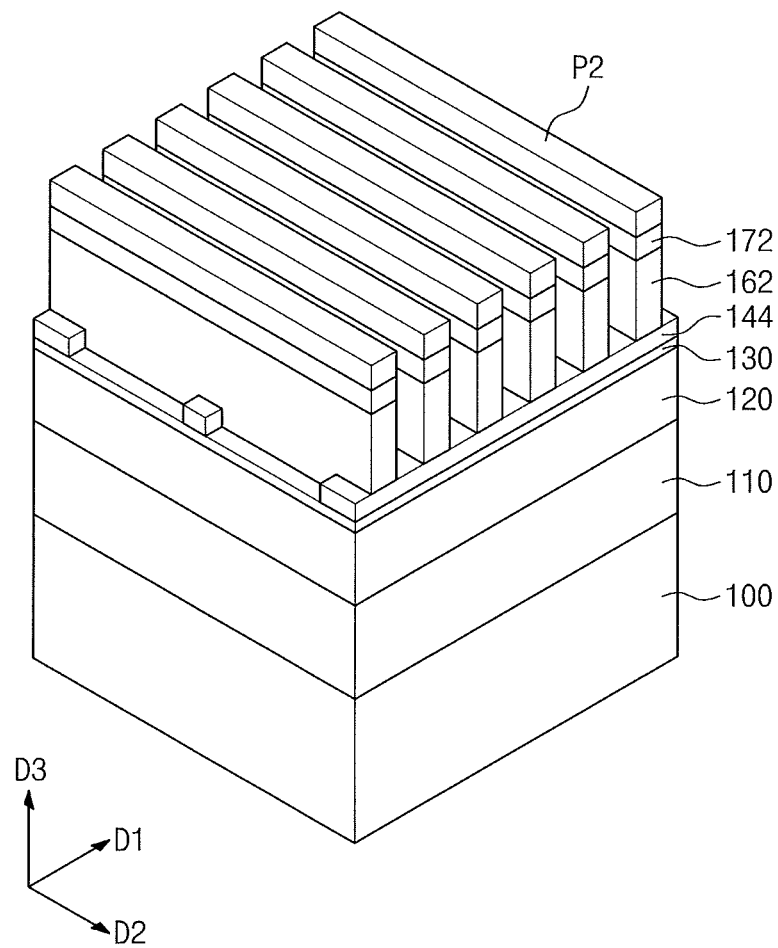
Figure 8B:
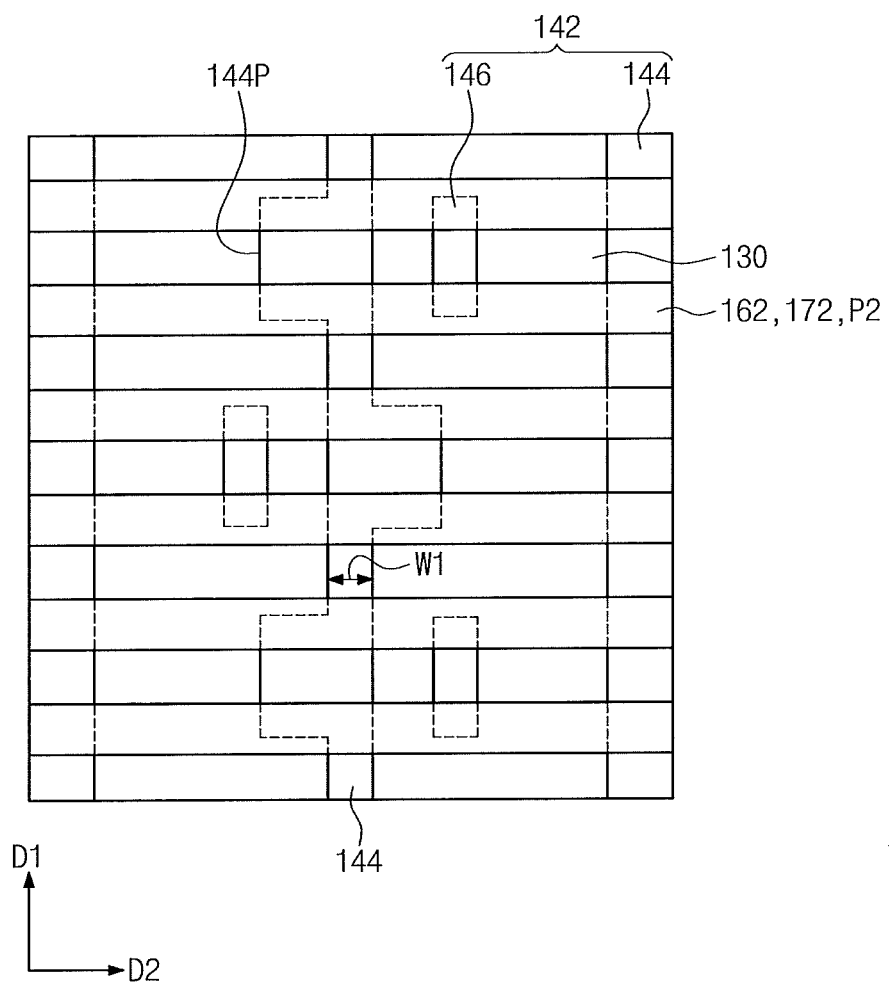

Referring to FIGS. 2, 7A, and 7B, a second mask layer 160 and a second anti-reflection layer 170 may be sequentially formed on the etch stop layer 130 (S40). The second mask layer 160 may cover the first line mask patterns 144 and the assistant mask patterns 146.

In some exemplary embodiments, the second mask layer 160 may be coated to cover the first line mask patterns 144 and the assistant mask patterns 146 by a spin-on-coating process. Because the second mask layer 160 is formed by the spin-on-coating process, the second mask layer 160 may have a flat top surface without an influence of profiles of the first line mask patterns 144 and the assistant mask patterns 146. In addition, after the spin-on-coating process, a bake process may be performed on the second mask layer 160.

The second mask layer 160 may be formed of a material having an etch selectivity with respect to the hard mask patterns 142 and the etch stop layer 130. In some exemplary embodiments, the second mask layer 160 may be formed of a material of which a main ingredient is carbon. For example, the second mask layer 160 may be formed of a material having a relatively high carbon content of about 80 wt % to 99 wt %. In exemplary embodiments, the second mask layer 160 may be formed of a SOH layer. The SOH layer may include a carbon-based SOH layer or a silicon-based SOH layer.

According to exemplary embodiments, the second anti-reflection layer 170 may be formed of the same material as the first anti-reflection layer 155 of FIG. 5 and may have the same function as the first anti-reflection layer 155, for example.

Next, a second photolithography process may be performed to form second photoresist patterns P2 on the second anti-reflection layer 170. For example, a second photoresist layer may be formed on the second anti-reflection layer 170 by coating a photoresist material, and an exposure process and a development process may be performed on the second photoresist layer to form the second photoresist patterns P2. In an exemplary embodiment, the second photolithography process for forming line and space patterns may be performed on the second photoresist layer. The second photoresist patterns P2 may intersect the first line mask patterns 144 and the assistant mask patterns 146 when viewed from a plan view. In other words, the second photoresist patterns P2 may extend in the second direction D2 to intersect the first line mask patterns 144 and the assistant mask patterns 146 and may be arranged with a constant pitch along the first direction D1. In an exemplary embodiment, each of the second photoresist patterns P2 may partially overlap with the protrusion 144P of the first line mask pattern 144 and the assistant mask pattern 146.

Referring to FIGS. 2 and 4, a second etching process may be performed on the resultant structure having the second photoresist patterns P2 of FIGS. 7A and 7B to sequentially etch the second anti-reflection layer 170, the second mask layer 160, the etch stop layer 130, the first mask layer 120, and the lower layer 110 (S60). In some embodiments, performing the second etching process (S60) may include performing a first step for etching the second anti-reflection layer 170 (S61), performing a second step for etching the second mask layer 160 (S62), performing a third step for etching the etch stop layer 130 (S63), performing a fourth step for etching the first mask layer 120 (S64), and performing a fifth step for etching the lower layer 110 (S65). Hereinafter, the steps of the second etching process will be described in more detail with reference to the following drawings.

Referring to FIGS. 2, 4, 8A, and 8B, the first and second steps (S61 and S62) of the second etching process may be performed on the substrate 100 having the second photoresist patterns P2 of FIGS. 7A and 7B to form second line mask patterns 162.

In exemplary embodiments, the first step of the second etching process may correspond to a step of etching the second anti-reflection layer 170 using the second photoresist patterns P2 as etch masks. The first step of the second etching process may be performed until the second mask layer 160 is exposed. The second step of the second etching process may correspond to a step of etching the exposed second mask layer 160 using the second photoresist patterns P2 as etch masks. The second step of the second etching process may be performed until the etch stop layer 130 is exposed. That is, in exemplary embodiments the second anti-reflection layer 170 and the second mask layer 160 may be sequentially etched by the first and second steps of the second etching process, which use the second photoresist patterns P2 as etch masks, thereby forming the second line mask patterns 162. At this time, second anti-reflection patterns 172 may be formed on the second line mask patterns 162, respectively. The second anti-reflection patterns 172 may correspond to portions of the second anti-reflection layer respectively remaining under the second photoresist patterns P2 after the first step of the second etching process.

The second line mask patterns 162 may have the substantially same planar shapes and the substantially same arrangement as the second photoresist patterns P2. In other words, in exemplary embodiments the second line mask patterns 162 may extend in the second direction D2 to intersect the first line mask patterns 144 and the assistant mask patterns 146 and may be arranged with a constant pitch along the first direction D1. Each of the second line mask patterns 162 may partially overlap with the protrusion 144P of the first line mask pattern 144 and the assistant mask pattern 146 and, as a result, the etch stop layer 130 may be locally exposed by the first line mask patterns 144, the assistant mask patterns 146, and the second line mask patterns 162.

In exemplary embodiments, the second anti-reflection patterns 172 and the second photoresist patterns P2 may remain on the second line mask patterns 162 after the first and second steps of the second etching process.

Figure 9:
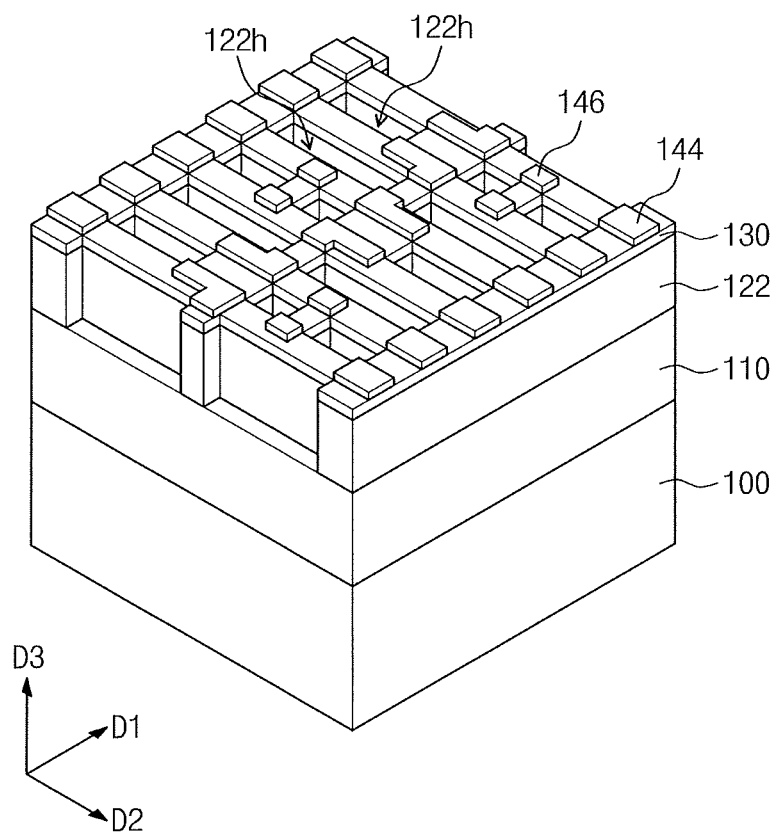
Figure 10A:
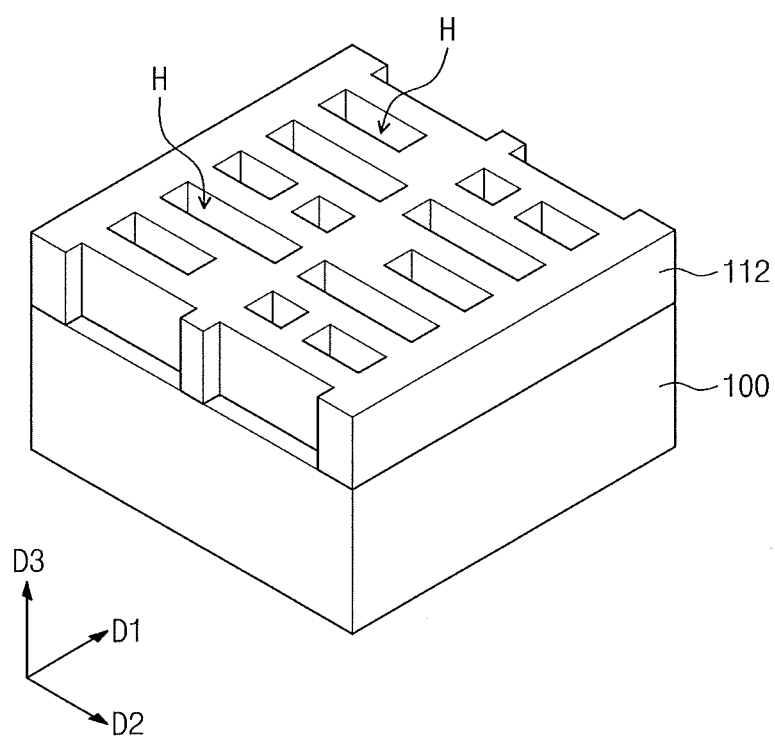
Figure 10B:
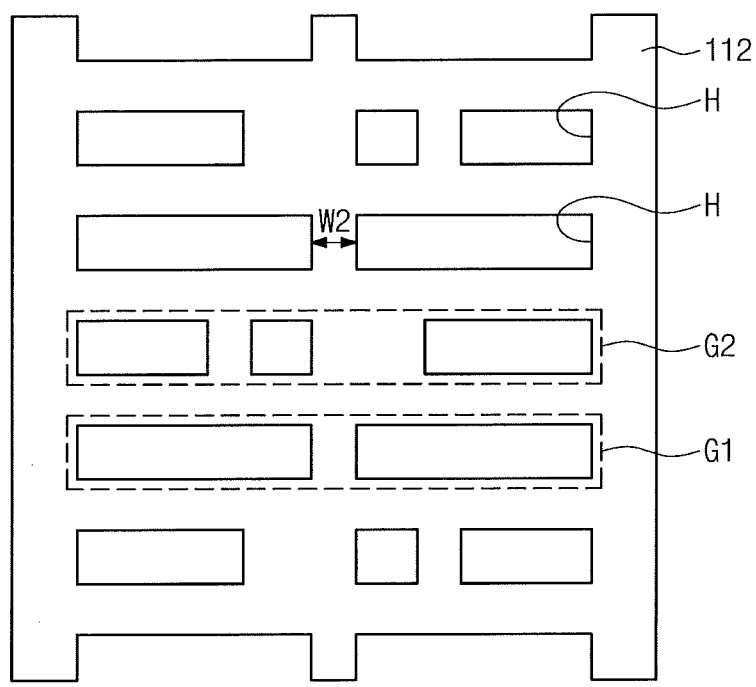

Referring to FIGS. 2, 4, and 9, the third and fourth steps (S63 and S64) of the second etching process may be performed on the resultant structure having the second line mask patterns 162 to form a first mask pattern 122.

That is, in exemplary embodiments the etch stop layer 130 and the first mask layer 120 may be etched using the first line mask patterns 144, the assistant mask patterns 146, and the second line mask patterns 162 as etch masks, thereby forming the first mask pattern 122. In other words, performing the third step of the second etching process may include etching the etch stop layer 130 using the mask patterns 144, 146, and 162 as etch masks until the first mask layer 120 is exposed. Performing the fourth step of the second etching process may include etching the first mask layer 120 of FIGS. 8A and 8B using the mask patterns 144, 146, and 162 as etch masks until the lower layer 110 is exposed, for example.

The first mask pattern 122 formed as described above may include a plurality of mask openings 122h exposing the lower layer 110. The mask openings 122h may be arranged in the first direction D1 and the second direction D2. In addition, the mask openings 122h may have various lengths in the second direction D2.

The second line mask patterns 162, the second anti-reflection patterns 172, and the second photoresist patterns P2 may be removed during the third and fourth steps of the second etching process. The etch stop layer 130, the first line mask patterns 144, and the assistant mask patterns 146 may partially remain on the first mask pattern 122 after the third and fourth steps of the second etching process.

Referring to FIGS. 2, 4, 10A, and 10B, the fifth step of the second etching process may be performed on the resultant structure of FIG. 9 to form a lower pattern 112 (S65).

In exemplary embodiments, in the fifth step of the second etching process, the lower layer 110 may be etched using the first mask pattern 122 as an etch mask to form the lower pattern 112. In other words, performing the fifth step of the second etching process may include etching the lower layer 110 using the first mask pattern 122 as an etch mask until the substrate 100 is exposed.

The lower pattern 112 may include a plurality of openings H exposing the substrate 100. The openings H may be arranged along the first direction D1 and the second direction D2, like the mask openings 122h of the first mask pattern 122. In addition, the openings H may have various lengths in the second direction D2. In exemplary embodiments, the openings H may include a first group G1 including some of the openings H and a second group G2 including others of the openings H. The openings H of the first group G1 may be spaced apart from each other in the second direction D2 and may have lengths in the second direction D2 which are substantially equal to each other. The openings H of the second group G2 may be spaced apart from the first group G1. In addition, the openings H of the second group G2 may be spaced apart from each other in the second direction D2 and may have lengths in the second direction D2 which are different from each other.

According to some exemplary embodiments, the lower pattern 112 may have widths of which each corresponds to a distance between the openings H adjacent to each other in the second direction D2. In an exemplary embodiment, the lower pattern 112 may have a second width W2. The second width W2 may be defined as a distance between the openings H of the first group G1 which are adjacent to each other in the second direction D2.

During the fifth step of the second etching process, the etch stop layer 130, a first line mask patterns 144, and the assistant mask patterns 146 may be removed but a portion of the first mask pattern 122 may remain on the lower pattern 112. The remaining portion of the first mask pattern 122 may be removed by an ashing process and/or a strip process, for example.

In exemplary embodiments in accordance with principles of inventive concepts, the first to fifth steps of the second etching process may be sequentially performed in the same chamber of the same etching apparatus. Additionally, the first to fifth steps of the second etching process may be performed using process recipes different from each other, and the process recipe of each of the first to fifth steps may be determined by the APC server 50 of FIG. 1.

Figure 11:
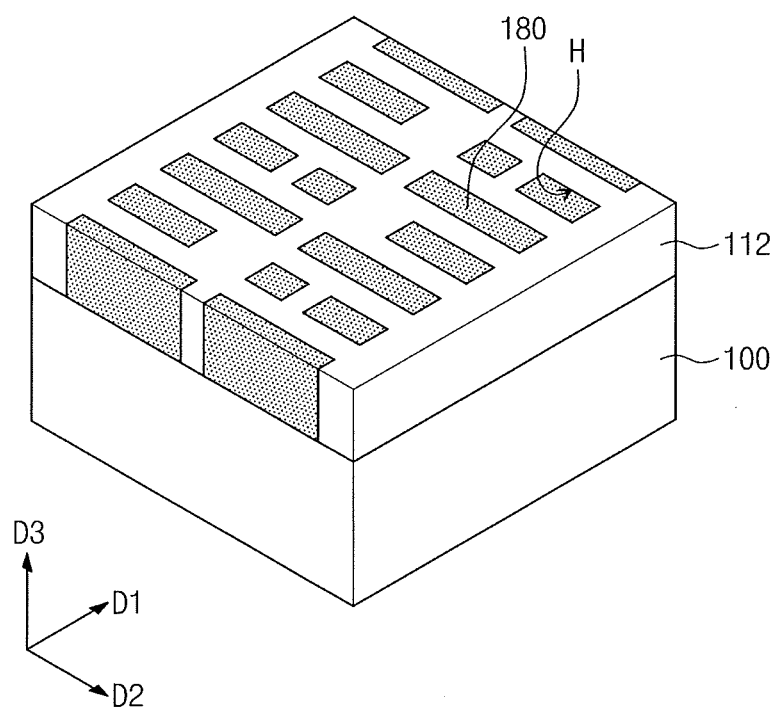

Referring to FIG. 11, fine patterns 180 may be formed in the openings H of the lower pattern 112. In some exemplary embodiments, a filling layer may be formed on the lower pattern 112 to fill the openings H, and a planarization process may be performed on the filling layer to form the fine patterns 180. The fine patterns 180 may be formed of a conductive material, a semiconductor material, or an insulating material, for example.

In the event that the fine patterns 180 are formed of the conductive material, the fine patterns 180 may include a metal silicide. For example, the fine patterns 180 may include at least one of titanium silicide, tantalum silicide, or tungsten silicide. In addition, the fine patterns 180 may further include a metal. For example, the metal of the fine patterns 180 may include at least one of titanium, tantalum, or tungsten. In some exemplary embodiments, each of the fine patterns 180 may include a metal silicide layer and a metal layer stacked on the metal silicide layer.

As described above, the fine patterns 180 may be formed by filling the openings H of the lower pattern 112, which are formed by performing two etching processes, with the filling material. If the width of the lower pattern 112 corresponding to the distance between the adjacent openings H were to be smaller than a desired value, a bridge may be formed between the fine patterns adjacent to each other. In accordance with principles of inventive concepts, a method of controlling an etching process, as described in greater detail below, ensures the formation of a lower pattern 112 having a uniform, desired, width, thereby preventing formation of such bridges.

A method of controlling the etching process for forming the fine patterns according to exemplary embodiments in accordance with principles of inventive concepts will be described hereinafter.

Figure 12:
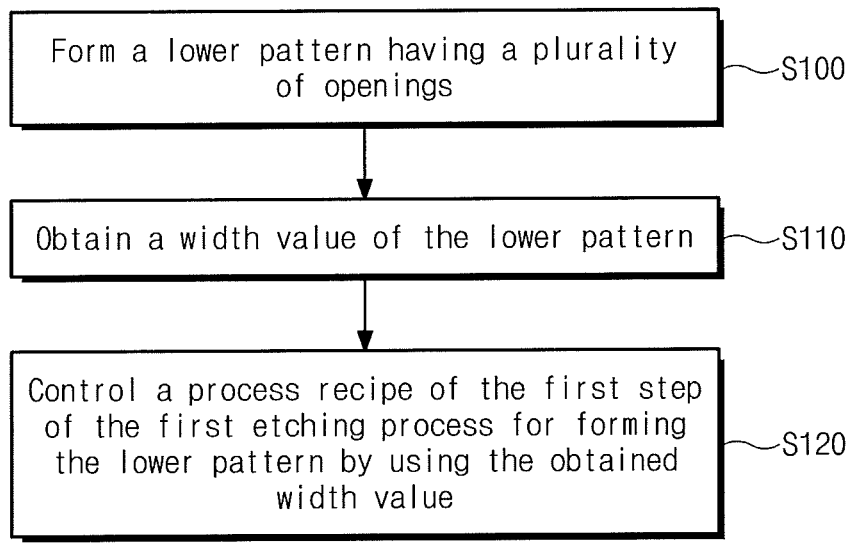
FIG. 12 is a flowchart illustrating a method of controlling an etching process for forming fine patterns of a semiconductor device according to some embodiments of the inventive concepts.

FIG. 12 is a flowchart illustrating an exemplary method of controlling an etching process for forming fine patterns of a semiconductor device in accordance with principles of inventive concepts.

Referring to FIG. 12, an exemplary method of controlling an etching process according to inventive concepts may include forming a lower pattern having a plurality of openings on a substrate (S100), obtaining a width value of the lower pattern (S110), and controlling a process recipe of a first etching process for forming the lower pattern by using the obtained, or measured, width value (S120).

In some exemplary embodiments, step S100 may correspond to the aforementioned method of forming the fine patterns of the semiconductor device. In exemplary embodiments, for example, the first mask pattern 122 defining the openings H may be formed on the lower layer 110, and the etching process using the first mask pattern 122 as an etch mask may be performed to form the lower pattern 112 having the plurality of openings H. A plurality of patterning processes may be performed for the formation of the lower pattern 112. In exemplary embodiments, at least two patterning processes may be performed to form the first mask pattern 122 and to etch the lower layer 110 using the first mask pattern 122 as the etch mask. These thin layer-formation processes, the photolithography processes, and the etching processes may be performed by the semiconductor process apparatuses of FIG. 1.

The lower pattern 112 may have various widths as described above. In exemplary embodiments, the lower pattern 112 may have the second width W2 corresponding to the distance between the adjacent openings H of the first group G1 and the width of the lower pattern 112 may be obtained, or determined, by the measurement apparatus 20 (e.g., the CD-SEM) of FIG. 1.

The width in the second direction D2 among the widths of the lower pattern 112 may be affected by the width of the hard mask pattern 142. For example, the hard mask pattern 142 formed by the first photolithography process and the first etching process may be used as the etch mask for forming the first mask pattern 122. The first mask pattern 122 may be used as the etch mask for forming the lower pattern 112. Thus, the width of the hard mask pattern 142 may affect the width of the first mask pattern 122. In other words, the width of the hard mask pattern 142 may affect the width of the lower pattern 112. For example, the first width W1 of the first line mask pattern 144 having the protrusions 144P may affect the width of the first mask pattern 122 corresponding thereto, so the first width W1 may affect the second width W2 of the lower pattern 112 formed in the subsequent process. As a result, there may be a constant correlation between the width of the hard mask pattern 142 and the width of the lower pattern 112. For example, the first width W1 of the first line mask pattern 144 and the second width W2 of the lower pattern 112 may have a strong positive correlation. As a result, the process recipe of the first etching process for forming the hard mask pattern 142 may be controlled to adjust the width in the second direction D2 of the lower pattern 112. In other words, in accordance with principles of inventive concepts a process dispersion of the first etching process may be managed to obtain a uniform and desired width (e.g., the second width W2) of the lower pattern 112. A method of controlling an etching process in accordance with principles of inventive concepts may relate to the management of the process dispersion of the first etching process.

Controlling the process recipe of the first etching process for forming the lower pattern by using the obtained/measured width value (S120) may be performed by the APC system 40 of FIG. 1. For example, the width of the lower pattern 112 obtained in step S110 may be transmitted to the APC server 50. The APC server 50 may compare the obtained/measured width of the lower pattern 112 with the process-recipe data of the first etching process to determine process-recipe data (i.e., the process-control data) optimized for obtaining the desired width value (e.g., a desired value of the second width W2) of the lower pattern 112 by the previously designed APC logic. For example, the process-recipe data may include at least one of an etching time, the amount of an etchant, or a kind of the etchant. In other words, in exemplary embodiments in accordance with principles of inventive concepts, controlling the process recipe of the first etching process in the step S120 may include controlling at least one of the etching time, the amount of etchant, or the kind of etchant, for example.

In some exemplary embodiments, the first etching process for forming the hard mask pattern 142 may include a plurality of steps for etching a plurality of stacked layers. For example, as described above, the first etching process may include the first step for etching the first anti-reflection layer 155, the second step for etching the sacrificial mask layer 150, and the third step for etching the hard mask layer 140. In an exemplary embodiment, controlling the process recipe of the first etching process in the step S120 may include controlling the process recipe of the first step of the first etching process, because the first step of the first etching process may primarily affect the width of the hard mask pattern 142.

A process recipe of an etching process may be controlled using a width value of a resultant structure formed after the etching process. However, according to some exemplary embodiments of the inventive concepts, the process recipe of the first etching process may be controlled using the width value of the lower pattern 112 formed by the second etching process performed after the first etching process. Thus, in accordance with principles of inventive concepts, at least one process variable between the first and second etching processes may also be reflected in controlling the process recipe of the first etching process and, as a result, a lower pattern 112 having a more uniform width may be formed. That is, forming fine patterns of a semiconductor device using a method in accordance with principles of inventive concepts reduces defect formation in the device.

Figure 13:
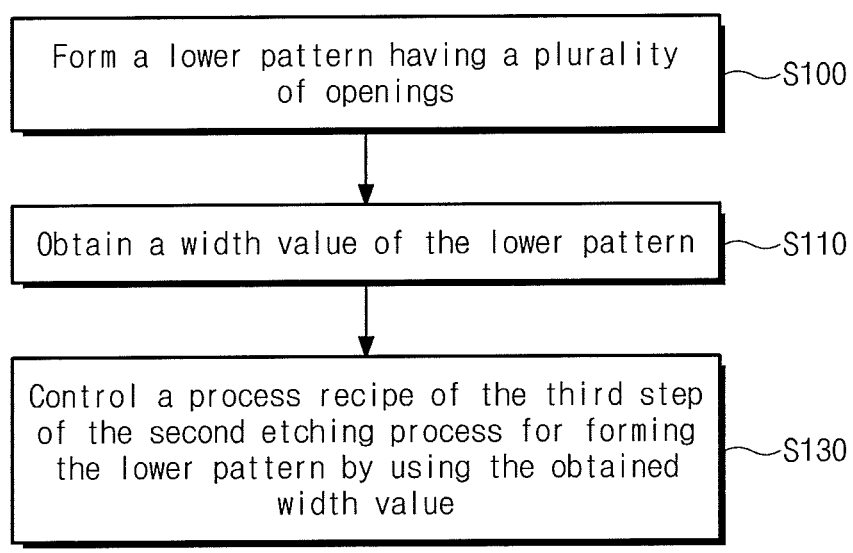
FIG. 13 is a flowchart illustrating a method of controlling an etching process for forming fine patterns of a semiconductor device according to other embodiments of the inventive concepts.

FIG. 13 is a flowchart illustrating a method of controlling an etching process for forming fine patterns of a semiconductor device according to other exemplary embodiments in accordance with principles of inventive concepts.

Referring to FIG. 13, exemplary methods of controlling an etching process in accordance with principles of inventive concepts may include forming a lower pattern having a plurality of openings on the substrate (S100), obtaining the width value of the lower pattern (S110), and controlling the process recipe of the third step of the second etching process for forming the lower pattern using the obtained/measured width value (S130). The step S100 and the step S110 may be the same as described with reference to FIG. 12, for example.

In the exemplary method of forming the fine patterns of the semiconductor device according to inventive concepts, performing the second etching process may include performing the first step for etching the second anti-reflection layer 170 (S61), performing the second step for etching the second mask layer 160 (S62), performing the third step for etching the etch stop layer 130 (S63), performing the fourth step for etching the first mask layer 120 (S64), and performing the fifth step for etching the lower layer 110 (S65). The second line mask patterns 162 intersecting the first line mask patterns 144 and the assistant mask patterns 146 may be formed by the first and second steps of the second etching process. In other words, the second line mask patterns 162 may include portions overlapping with the hard mask patterns 142. Other portions of the hard mask patterns 142, which are not overlapped with the second line mask patterns 162, may be used as etch masks during the third step of the second etching process, for example.

Even though, in exemplary embodiments, the hard mask patterns 142 are formed of a material having an etch selectivity with respect to the etch stop layer 130, the hard mask patterns 142 may be partially etched during the third step of the second etching process. If the hard mask patterns 142 were to be over-etched, the over-etched hard mask patterns 142 may affect the width of the first mask pattern 122 and the desired width (e.g., the second width W2) of the lower pattern 112 may not be obtained. In exemplary embodiments in accordance with principles of inventive concepts, the process recipe of the third step of the second etching process may be controlled to reduce an etch amount of the hard mask patterns 142 to thereby ensure that the lower pattern 112 may have the desired width. In accordance with principles of inventive concepts, if the width of the lower pattern 112 is greater than the desired value, the process recipe of the third step of the second etching process may be controlled to increase an etch amount of the hard mask pattern 142 as compared with an etched amount of the hard mask pattern 142 etched under a previous process recipe. In this manner, in accordance with principles of inventive concepts, the desired width (e.g., the second width W2) of the lower pattern 112 may be obtained. As a result, in accordance with principles of inventive concepts, the process recipe of the third step of the second etching process (i.e., the process recipe for etching the etch stop layer 130) may be controlled to obtain the desired and uniform width of the lower pattern 112.

As described with reference to FIG. 12, controlling the process recipe of the third step of the second etching process may be performed by the APC system 40 of FIG. 1. Controlling the process recipe of the third step of the second etching process may include controlling at least one of an etching time, the amount of an etchant, or the kind of the etchant, for example. In an exemplary embodiment, if the etch stop layer 130 is formed of a silicon oxide layer formed by an ALD process, the process recipe of the third step of the second etching process may be controlled by using and controlling a hydrocarbon-based polymer gas, for example.

Figure 14:
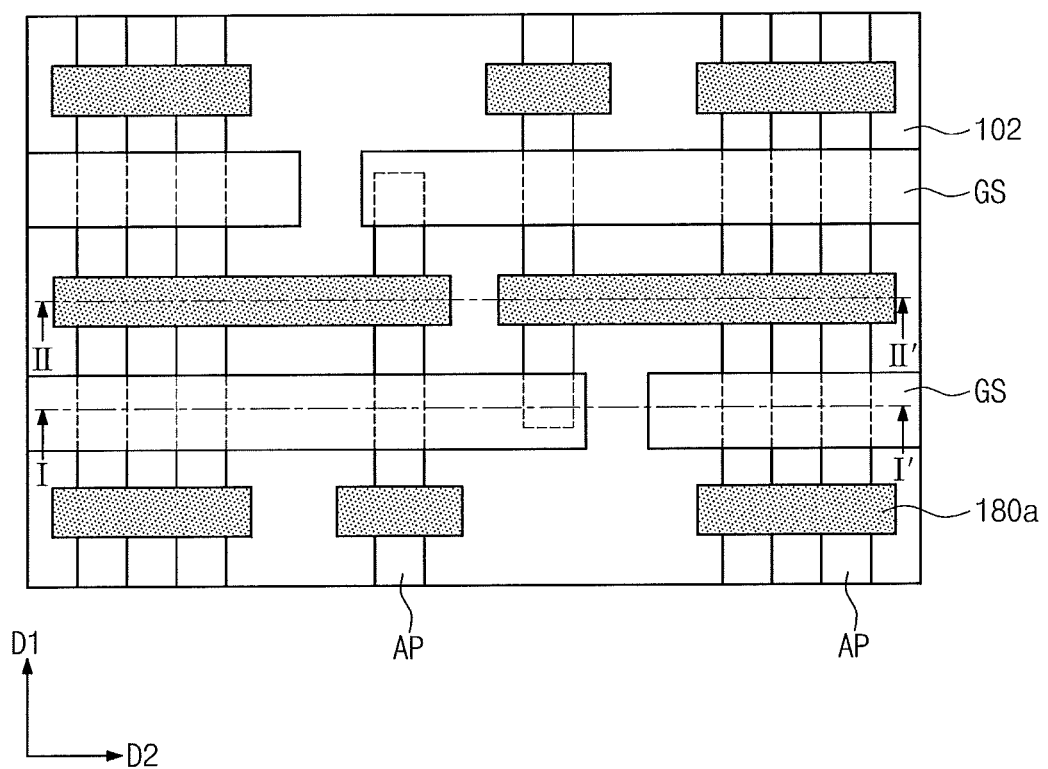
FIG. 14 is a plan view illustrating a method of manufacturing a semiconductor device using a method of forming fine patterns according to exemplary embodiments in accordance with principles of inventive concepts.
Figure 15A:
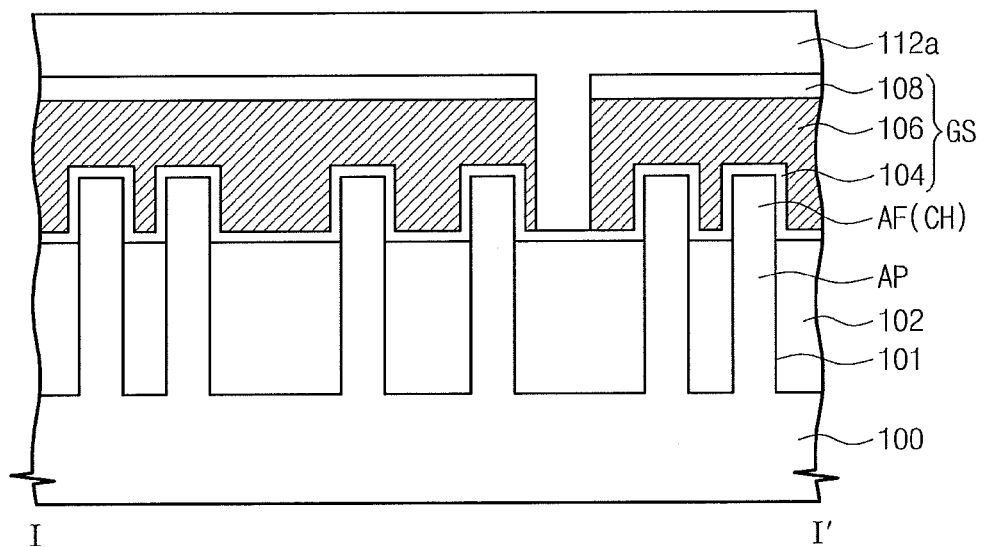
FIGS. 15A and 15B are cross-sectional views taken along lines I-I' and II-II' of FIG. 14, respectively.
Figure 15B:
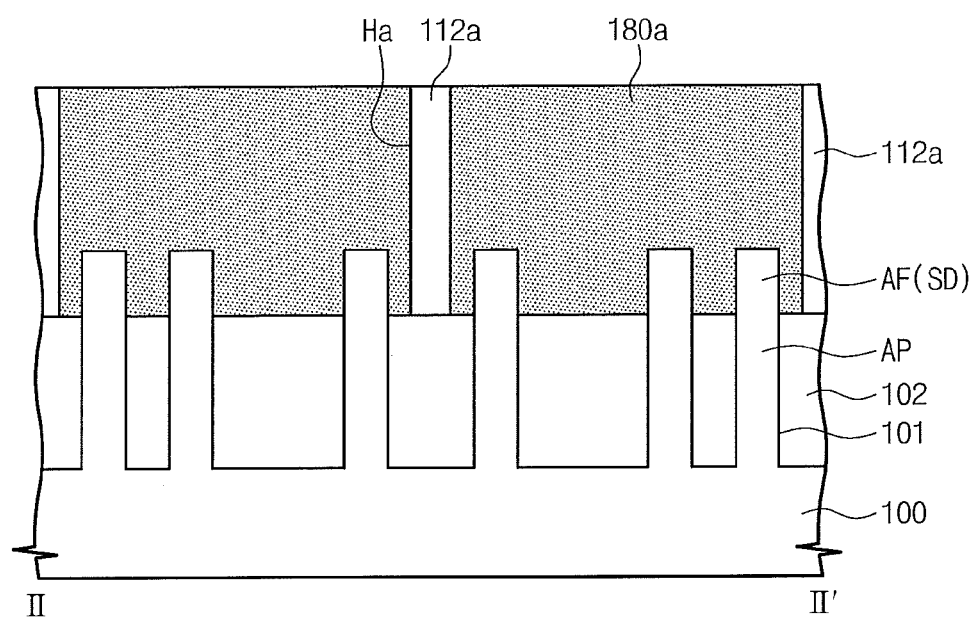

FIG. 14 is a plan view illustrating a method of manufacturing a semiconductor device using a method of forming fine patterns according to exemplary embodiments in accordance with principles of inventive concepts. FIGS. 15A and 15B are cross-sectional views taken along lines I-I' and II-II' of FIG. 14, respectively.

Referring to FIGS. 14, 15A, and 15B, trenches 101 may be formed in a substrate 100 to define active patterns AP. The active patterns AP may have shapes protruding from the substrate 100 in a direction perpendicular to a top surface of the substrate 100. Device isolation patterns 102 may be formed in the trenches 101. In exemplary embodiments, forming the device isolation patterns 102 may include forming a device isolation layer filling the trenches 101 on the substrate 100 and planarizing the device isolation layer until the substrate 100 is exposed. Upper portions of the device isolation patterns 102 may be etched to expose upper portions of the active patterns AP. The upper portions of the active patterns AP exposed by the device isolation patterns 102 may be defined as active fins AF.

Gate structures GS may be formed on the substrate 100 to cross over the active patterns AP. Each of the gate structures GS may include a gate dielectric pattern 104, a gate electrode 106, and a capping pattern 108, which are sequentially stacked on the substrate 100. In exemplary embodiments, a gate dielectric layer, a gate electrode layer, and a capping layer may be sequentially formed on the substrate 100 having the active patterns AP, and the capping layer, the gate electrode layer, and the gate dielectric layer may be patterned to form the gate structures GS, for example. The gate dielectric pattern 104 may include at least one of a silicon oxide layer, a silicon oxynitride layer, or a high-k dielectric layer of which a dielectric constant is higher than that of the silicon oxide layer. The gate electrode 106 may include at least one of a doped semiconductor, a metal, or a conductive metal nitride. The capping pattern 108 may include at least one of a silicon oxide layer, a silicon nitride layer, or a silicon oxynitride layer. Even though not shown in the drawings, gate spacers (not shown) may be formed on opposite sidewalls of each of the gate structures GS. Portions of the active fins AF, which are disposed under the gate structures GS, may correspond to channel regions CH of transistors.

Source/drain regions SD may be formed in the active patterns AP at both sides of each of the gate structures GS. In exemplary embodiments, the source/drain regions SD may be confined in the active fins AF, as illustrated in FIG. 15B.

Alternatively, the source/drain regions SD may extend downward between the device isolation patterns 102.

An interlayer insulating layer 112a may be formed on the substrate 100 to cover the gate structures GS. For example, the interlayer insulating layer 112a may include at least one of a silicon oxide layer and a silicon oxynitride layer.

Connection conductive patterns 180a may be formed to penetrate the interlayer insulating layer 112a. The connection conductive patterns 180a may penetrate the interlayer insulating layer 112a at both sides of each of the gate structures GS so as to be connected to the source/drain regions SD. At least one of the connection conductive patterns 180a may electrically connect the source/drain regions SD, which are spaced apart from each other in the second direction D2, with the device isolation pattern 102 interposed therebetween, to each other. Top surfaces of the connection conductive patterns 180a may be higher than top surfaces of the gate structures GS.

According to exemplary embodiments, the connection conductive patterns 180a may be formed using a method of forming the fine patterns in accordance with principles of inventive concepts, as previously described. In exemplary embodiments, forming the connection conductive patterns 180a may include patterning the interlayer insulating layer 112a at both sides of the gate structure GS to form a plurality of openings Ha, exposing the source/drain regions SD, forming a connection conductive layer filling the openings Ha on the interlayer insulating layer 112a, and planarizing the connection conductive layer until the interlayer insulating layer 112a is exposed.

The connection conductive patterns 180a may include a metal silicide. For example, the connection conductive patterns 180a may include at least one of titanium silicide, tantalum silicide, or tungsten silicide. Each of the connection conductive patterns 180a may further include a metal layer. For example, the metal layer may include at least one of titanium, tantalum, or tungsten. In exemplary embodiments, each of the connection conductive patterns 180a may include a metal silicide layer and the metal layer stacked on the metal silicide layer.

The etching process used for forming the connection conductive patterns 180a may be controlled by the method of controlling the etching process according to principles of inventive concepts, as previously described to thereby prevent a bridge defect between connection conductive patterns 180a adjacent to each other.

Even though not shown in the drawings, contacts (not shown) being in contact with the connection conductive patterns 180a may be formed on the interlayer insulating layer 112a.

Figure 16:
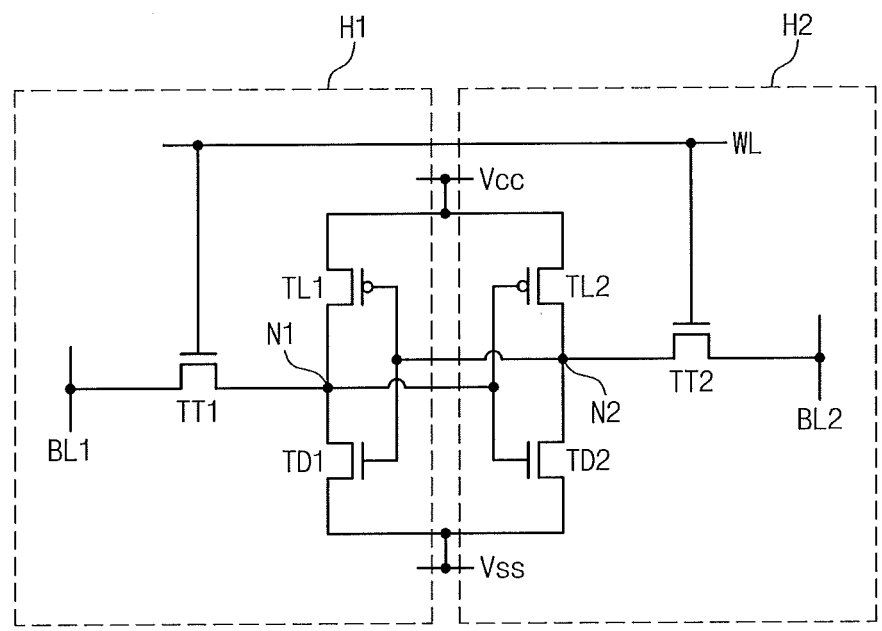
FIG. 16 is an equivalent circuit diagram of a complementary metal-oxide-semiconductor static random access memory (CMOS SRAM) cell included in a semiconductor device manufactured according to exemplary embodiments in accordance with principles of inventive concepts.

FIG. 16 is an equivalent circuit diagram of a complementary metal-oxide-semiconductor static random access memory (CMOS SRAM) cell included in a semiconductor device manufactured according to exemplary embodiments in accordance with principles of inventive concepts. Referring to FIG. 16, a CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver and transfer transistors TD1, TD2, TT1, and TT2 may be NMOS transistors, and the load transistors TL1 and TL2 may be PMOS transistors. At least one of the driver, transfer, and load transistors TD1, TD2, TT1, TT2, TL1, and TL2 may be one of the field effect transistors according to the aforementioned embodiments of the inventive concepts.

A first driver transistor TD1 and a first transfer transistor TT1 may be connected in series with each other. A source region of the first driver transistor TD1 may be electrically connected to a ground line Vss, and a drain region of the first transfer transistor TT1 may be electrically connected to a first bit line BL1. A second driver transistor TD2 and a second transfer transistor TT2 may be connected in series to each other. A source region of the second driver transistor TD2 may be electrically connected to the ground line Vss, and a drain region of the second transfer transistor TT2 may be electrically connected to a second bit line BL2.

A source region and a drain region of a first load transistor TL1 may be connected to a power line Vcc and a drain region of the first driver transistor TD1, respectively. A source region and a drain region of a second load transistor TL2 may be connected to the power line Vcc and a drain region of the second driver transistor TD2, respectively. The drain region of the first load transistor TL1, the drain region of the first driver transistor TD1, and a source region of the first transfer transistor TT1 may correspond to a first node N1. The drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2, and a gate electrode of the second driver transistor TD2 and a gate electrode of the second load transistor TL2 may be electrically connected to the first node N1, Gate electrodes of the first and second transfer transistors TT1 and TT2 may be electrically connected to a word line WL. The first driver transistor TD1, the first transfer transistor TT1, and the first load transistor TL1 may constitute a first half cell H1. The second driver transistor TD2, the second transfer transistor TT2, and the second load transistor TL2 may constitute a second half cell H2.

Embodiments of inventive concepts are not limited to an SRAM device, however, and in other exemplary embodiments, a method in accordance with principle of inventive concepts may be applied to a dynamic random access memory (DRAM) device, a magnetic random access memory (MRAM) device, or another semiconductor device and a method of fabricating the same, for example.

Figure 17:
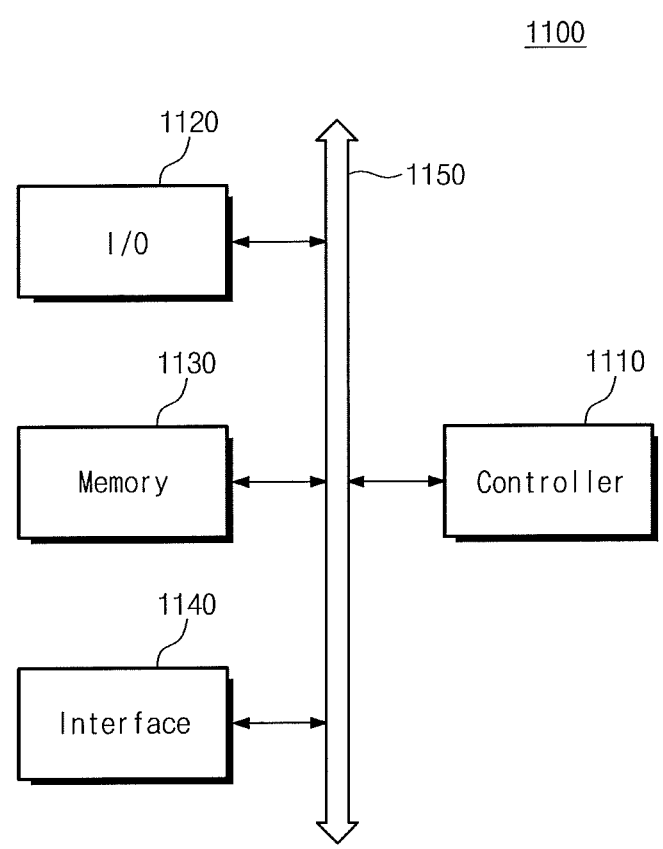
FIG. 17 is a schematic block diagram illustrating an electronic system including a semiconductor device manufactured according to exemplary embodiments in accordance with principles of inventive concepts.

FIG. 17 is a schematic block diagram illustrating an electronic system including a semiconductor device manufactured in accordance with principles of inventive concepts.

Referring to FIG. 17, an exemplary embodiment of an electronic system 1100 in accordance with principles of inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data are transmitted.

The controller 1110 may include at least one of a microprocessor, a digital signal processor, a microcontroller, or another logic device having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast DRAM device and/or a fast SRAM device which acts as a cache memory for improving an operation of the controller 1110, for example. A semiconductor device according exemplary embodiments in accordance with principles of inventive concepts may be provided into the memory device 1130, the controller 1110, and/or the I/O unit 1120, for example.

The electronic system 1100 may be applied to a personal digital assistant (PDA), a portable computer, a web tablet, a wireless phone, a mobile phone, a digital music player, a memory card or other electronic products and may receive or transmit information data by wireless communications.

Figure 18:
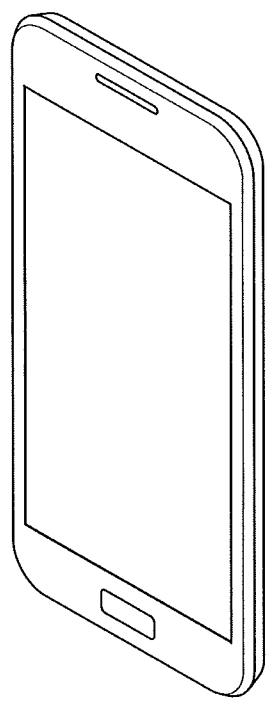
FIG. 18 illustrates a mobile phone implemented with an electronic system.

The electronic system 1100 may be applied to electronic control devices of various electronic devices. FIG. 18 illustrates a mobile phone 1200 implemented with the electronic system 1100 of FIG. 17. In other exemplary embodiments, the electronic system 1100 of FIG. 17 may be applied to a portable notebook, a MP3 player, a navigation device, a solid state disk (SSD), a car, or household appliances, for example.

Employing a process in accordance with principles of inventive concepts may improve the process dispersion of an etching process for forming fine patterns of the semiconductor device and, as a result, bridge defects between the fine patterns may be prevented.

While inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scope of inventive concepts are to be determined by the broadest permissible interpretation of the following claims and their equivalents, and shall not be restricted or limited by the foregoing description.

What is claimed is:

1. A method of controlling an etching process for forming fine patterns of a semiconductor device, the method comprising:
    forming a lower pattern having a plurality of openings on a substrate;
    measuring a width of the lower pattern; and
    controlling a process recipe of an etching process for forming the lower pattern by using the width,
    wherein forming the lower pattern comprises:
    sequentially forming a first mask layer and a hard mask layer on a lower layer;
    patterning the hard mask layer to form hard mask patterns, the hard mask patterns including first line mask patterns extending in a first direction and spaced apart from each other in a second direction intersecting the first direction;
    forming second line mask patterns intersecting the first line mask patterns and extending in the second direction;
    etching the first mask layer using the first and second line mask patterns as etch masks to form a first mask pattern; and
    etching the lower layer by using the first mask pattern as an etch mask,
    wherein patterning the hard mask layer includes performing a first etching process, and
    wherein controlling the process recipe of the etching process for forming the lower pattern includes controlling a process recipe of the first etching process.

2. The method of claim 1, wherein the openings are arranged along the first direction and the second direction, and
    wherein the width value corresponds to a distance between the openings adjacent to each other in the second direction.

3. The method of claim 1, wherein patterning the hard mask layer to form the hard mask patterns comprises:
    sequentially forming a sacrificial mask layer and a first anti-reflection layer on the hard mask layer; and
    forming first photoresist patterns on the first anti-reflection layer,
    wherein the first etching process is performed on the substrate having the first photoresist patterns to sequentially etch the first anti-reflection layer, the sacrificial mask layer, and the hard mask layer.

4. The method of claim 3, wherein the first etching process includes a first step for etching the first anti-reflection layer, a second step for etching the sacrificial mask layer, and a third step for etching the hard mask layer,
    wherein the first, second, and third steps are sequentially performed in the same chamber, and
    wherein controlling the process recipe of the first etching process includes controlling a process recipe of the first step.

5. The method of claim 1, wherein at least one of the first line mask patterns has opposite sidewalls having protrusions, and
    wherein the protrusions adjacent to each other among the protrusions protrude in directions opposite to each other and are not overlapped with each other in the second direction.

6. The method of claim 5, wherein the hard mask patterns further comprise: assistant mask patterns of which each has an island shape that is long in the first direction, and
    wherein each of the assistant mask patterns is disposed opposite a corresponding protrusion of the at least one of the first line mask patterns and aligned with the corresponding protrusion in the second direction.

7. The method of claim 6, wherein the second line mask patterns intersect the assistant mask patterns and the protrusions, and
    wherein the etching process for forming the first mask pattern uses the first and second line mask patterns and the assistant mask patterns as etch masks.

8. The method of claim 7, wherein the plurality of openings comprises:
    a first group of openings; and
    a second group of openings,
    wherein the openings of the first group are spaced apart from each other in the second direction and have lengths in the second direction which are substantially equal to each other,
    wherein the openings of the second group are spaced apart from the openings of the first group in the first direction,
    wherein the openings of the second group are spaced apart from each other in the second direction and have lengths in the second direction which are different from each other, and
    wherein the measured width corresponds to a distance between the openings of the first group adjacent to each other in the second direction.

9. The method of claim 1, wherein controlling the process recipe includes controlling at least one of an etching time, the amount of an etchant, or a kind of the etchant.

10. A method of controlling an etching process for forming fine patterns of a semiconductor device, the method comprising:
    forming a lower pattern having a plurality of openings on a substrate;
    measuring a width of the lower pattern; and
    controlling a process recipe of an etching process for forming the lower pattern using the measured width, wherein forming the lower pattern includes
sequentially forming a first mask layer and an etch stop layer on a lower layer;
forming hard mask patterns on the etch stop layer, the hard mask patterns including first line mask patterns extending in a first direction and spaced apart from each other in a second direction intersecting the first direction;
forming a second mask layer covering the hard mask patterns on the etch stop layer, the second mask layer including an organic material;
forming a first anti-reflection layer on the second mask layer;
forming first photoresist patterns on the first anti-reflection layer, the first photoresist patterns extending in the second direction to intersect the first line mask patterns when viewed from a plan view; and
performing a first etching process on the substrate having the first photoresist patterns to sequentially etch the first anti-reflection layer, the second mask layer, the etch stop layer, the first mask layer, and the lower layer,
wherein controlling the process recipe of the etching process for forming the lower pattern includes controlling a process recipe of the first etching process for etching the etch stop layer.

11. The method of claim 10, wherein the openings are arranged in the first direction and the second direction, and
wherein the measured width corresponds to a distance between the openings adjacent to each other in the second direction.

12. The method of claim 10, wherein the first etching process includes a first step for etching the first anti-reflection layer, a second step for etching the second mask layer, a third step for etching the etch stop layer, a fourth step for etching the first mask layer, and a fifth step for etching the lower layer,
wherein the first to fifth steps are sequentially performed in the same chamber, and
wherein controlling the process recipe of the etching process for forming the lower pattern includes controlling a process recipe of the third step of the first etching process.

13. The method of claim 10, wherein forming the hard mask patterns comprises:
sequentially forming a hard mask layer, a sacrificial mask layer, and a second anti-reflection layer on the etch stop layer;
forming second photoresist patterns on the second anti-reflection layer; and
performing a second etching process on the substrate having the second photoresist patterns to sequentially etch the second anti-reflection layer, the sacrificial mask layer, and the hard mask layer.

14. The method of claim 10, wherein at least one of the first line mask patterns has opposite sidewalls having protrusions, and
wherein the protrusions adjacent to each other among the protrusions protrude in directions opposite to each other and are not overlapped with each other in the second direction.

15. The method of claim 14, wherein the hard mask patterns further comprise: assistant mask patterns of which each has an island shape that is long in the first direction,
wherein each of the assistant mask patterns is disposed opposite a corresponding protrusion of the at least one of the first line mask patterns aligned with the corresponding protrusion in the second direction, and
wherein the first photoresist patterns intersect the assistant mask patterns and the protrusions when viewed from a plan view.

* * * * *